United States Patent
Roper et al.

(10) Patent No.: US 7,053,478 B2
(45) Date of Patent: May 30, 2006

(54) PITCH CHANGE AND CHIP SCALE STACKING SYSTEM

(75) Inventors: David L. Roper, Austin, TX (US); James W. Cady, Austin, TX (US); James Wilder, Austin, TX (US); James Douglas Wehrly, Jr., Austin, TX (US); Jeff Buchle, Austin, TX (US); Julian Dowden, Austin, TX (US)

(73) Assignee: Staktek Group L.P., Austin, TX (US)

( * ) Notice: Subject to any disclaimer, the term of this patent is extended or adjusted under 35 U.S.C. 154(b) by 21 days.

(21) Appl. No.: 10/914,483

(22) Filed: Aug. 9, 2004

(65) Prior Publication Data

US 2005/0018412 A1    Jan. 27, 2005

Related U.S. Application Data

(63) Continuation-in-part of application No. 10/005,581, filed on Oct. 29, 2001, now Pat. No. 6,576,992, which is a continuation-in-part of application No. 10/453,398, filed on Jun. 3, 2003.

(51) Int. Cl.
*H01L 23/02* (2006.01)

(52) U.S. Cl. ............... 257/686; 257/777; 438/109; 361/735; 361/790

(58) Field of Classification Search ............... 438/107, 438/108, 109; 257/686, 777–778, 737–738; 361/735, 790, 749, 767
See application file for complete search history.

(56) References Cited

U.S. PATENT DOCUMENTS

| | | |
|---|---|---|
| 3,411,122 A | 11/1968 | Schiller et al. |
| 3,436,604 A | 4/1969 | Hyltin |
| 3,654,394 A | 4/1972 | Gordon |
| 3,727,064 A | 4/1973 | Bottini |

(Continued)

FOREIGN PATENT DOCUMENTS

DE    004215467 (A)    11/1992

(Continued)

OTHER PUBLICATIONS

William R. Newberry, Design Techniques for Ball Grid Arrays, Xynetix Design Systems, Inc., Portland, Maine, Published on the Internet.

(Continued)

*Primary Examiner*—Michael Trinh
*Assistant Examiner*—Thanh Y. Tran
(74) *Attorney, Agent, or Firm*—Andrews Kurth L.L.P.; J. Scott Denko

(57) ABSTRACT

The present invention stacks integrated circuits into modules that conserve board surface area. In a two-high stack or module devised in accordance with a preferred embodiment of the present invention, a pair of integrated circuits is stacked, with one integrated circuit above the other. The two integrated circuits are connected with a pair of flexible circuit structures. Each of the pair of flexible circuit structures is partially wrapped about a respective opposite lateral edge of the lower integrated circuit of the module. The flex circuit pair connects the upper and lower integrated circuits and provides a thermal and electrical path connection path between the module and its application environment. The module has a ballout pattern with a different pitch and/or supplemental module contacts devised to allow combined signaling to the integrated circuits through contacts having a desired ballout footprint. The present invention may be employed to advantage in numerous configurations and combinations of integrated circuits in modules provided for high-density memories or high capacity computing.

34 Claims, 15 Drawing Sheets

U.S. PATENT DOCUMENTS

| | | |
|---|---|---|
| 3,746,934 A | 7/1973 | Stein |
| 3,766,439 A | 10/1973 | Isaacson |
| 3,772,776 A | 11/1973 | Weisenburger |
| 3,983,547 A | 9/1976 | Almasi |
| 4,079,511 A | 3/1978 | Grabbe |
| 4,103,318 A | 7/1978 | Schwede |
| 4,288,841 A | 9/1981 | Gogal |
| 4,398,235 A | 8/1983 | Lutz et al. |
| 4,406,508 A | 9/1983 | Sadigh-Behzadi |
| 4,437,235 A | 3/1984 | McIver |
| 4,466,183 A | 8/1984 | Burns |
| 4,513,368 A | 4/1985 | Houseman |
| 4,587,596 A | 5/1986 | Bunnell |
| 4,645,944 A | 2/1987 | Uya |
| 4,696,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisaki et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,057,903 A | 10/1991 | Olla |
| 5,064,762 A | 11/1991 | Nishiguchi |
| 5,068,708 A | 11/1991 | Newman |
| 5,081,067 A | 1/1992 | Shimru et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow, 3rd et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,311,401 A | 5/1994 | Gates, Jr. et al. |
| 5,313,097 A | 5/1994 | Haj-Ali-Ahmadi et al. |
| 5,343,075 A | 8/1994 | Nishino |
| 5,347,428 A | 9/1994 | Carson et al. |
| 5,357,478 A | 10/1994 | Kikuda et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,394,010 A | 2/1995 | Tazawa et al. |
| 5,394,303 A | 2/1995 | Yamaji |
| 5,397,916 A | 3/1995 | Normington |
| 5,402,006 A | 3/1995 | O'Donley |
| 5,420,751 A | 5/1995 | Burns |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley, III et al. |
| 5,479,318 A | 12/1995 | Burns |
| 5,484,959 A | 1/1996 | Burns |
| 5,493,476 A | 2/1996 | Burns |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,541,812 A | 7/1996 | Burns |
| 5,543,664 A | 8/1996 | Burns |
| 5,561,591 A | 10/1996 | Burns |
| 5,566,051 A | 10/1996 | Burns |
| 5,572,065 A | 11/1996 | Burns |
| 5,588,205 A | 12/1996 | Roane |
| 5,592,364 A | 1/1997 | Roane |
| 5,594,275 A | 1/1997 | Kwon et al. |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,729,894 A * | 3/1998 | Rostoker et al. ............... 29/832 |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A * | 7/1998 | Nicewarner et al. ........ 438/107 |
| 5,778,522 A | 7/1998 | Burns |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,828,125 A | 10/1998 | Burns |
| 5,835,988 A | 11/1998 | Ishii |
| 5,841,721 A | 11/1998 | Kwon et al. |
| 5,869,353 A | 2/1999 | Levy et al. |
| 5,895,970 A | 4/1999 | Miyoshi |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |
| 5,926,369 A | 7/1999 | Ingraham et al. |
| 5,949,657 A | 9/1999 | Karabatsos |
| 5,953,215 A | 9/1999 | Karabatsos |
| 5,959,839 A | 9/1999 | Gates |
| 5,963,427 A | 10/1999 | Bollesen |

| | | |
|---|---|---|
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,014,316 A | 1/2000 | Eide |
| 6,025,642 A | 2/2000 | Burns |
| 6,028,352 A | 2/2000 | Eide |
| 6,028,365 A | 2/2000 | Akram et al. |
| 6,034,878 A | 3/2000 | Osaka et al. |
| 6,040,624 A | 3/2000 | Chambers et al. |
| 6,072,233 A | 6/2000 | Corisis et al. |
| 6,084,293 A | 7/2000 | Ohuchi |
| 6,084,294 A | 7/2000 | Tomita |
| 6,097,087 A | 8/2000 | Farnworth et al. |
| 6,121,676 A | 9/2000 | Solberg |
| RE36,916 E | 10/2000 | Moshayedi |
| 6,157,541 A | 12/2000 | Hacke |
| 6,165,817 A | 12/2000 | Akram |
| 6,172,874 B1 | 1/2001 | Bartilson |
| 6,178,093 B1 | 1/2001 | Bhatt et al. |
| 6,187,652 B1 | 2/2001 | Chou et al. |
| 6,205,654 B1 | 3/2001 | Burns |
| 6,208,521 B1 | 3/2001 | Nakatsuka |
| 6,222,737 B1 | 4/2001 | Ross |
| 6,225,688 B1 | 5/2001 | Kim et al. |
| 6,233,650 B1 | 5/2001 | Johnson et al. |
| 6,234,820 B1 | 5/2001 | Perino et al. |
| 6,262,476 B1 | 7/2001 | Vidal |
| 6,262,895 B1 | 7/2001 | Forthun |
| 6,265,660 B1 | 7/2001 | Tandy |
| 6,266,252 B1 | 7/2001 | Karabatsos |
| 6,281,577 B1 | 8/2001 | Oppermann et al. |
| 6,285,560 B1 | 9/2001 | Lyne |
| 6,288,907 B1 | 9/2001 | Burns |
| 6,300,679 B1 * | 10/2001 | Mukerji et al. ............. 257/738 |
| 6,303,981 B1 | 10/2001 | Moden |
| 6,310,392 B1 | 10/2001 | Burns |
| 6,313,998 B1 | 11/2001 | Kledzik |
| 6,316,825 B1 | 11/2001 | Park et al. |
| 6,323,060 B1 | 11/2001 | Isaak |
| 6,329,708 B1 | 12/2001 | Komiyama |
| 6,336,262 B1 | 1/2002 | Dalal et al. |
| 6,351,029 B1 | 2/2002 | Isaak |
| 6,360,433 B1 | 3/2002 | Ross |
| 6,368,896 B1 | 4/2002 | Farnworth et al. |
| 6,376,769 B1 | 4/2002 | Chung |
| 6,392,162 B1 | 5/2002 | Karabatsos |
| 6,410,857 B1 | 6/2002 | Gonya |
| 6,426,240 B1 | 7/2002 | Isaak |
| 6,426,549 B1 | 7/2002 | Isaak |
| 6,426,560 B1 | 7/2002 | Kawamura et al. |
| 6,433,418 B1 | 8/2002 | Fujisawa et al. |
| 6,444,490 B1 | 9/2002 | Bertin et al. |
| 6,444,921 B1 * | 9/2002 | Wang et al. ................ 174/260 |
| 6,446,158 B1 | 9/2002 | Karabatsos |
| 6,449,159 B1 | 9/2002 | Haba |
| 6,452,826 B1 | 9/2002 | Kim et al. |
| 6,462,412 B1 | 10/2002 | Kamei et al. |
| 6,465,877 B1 | 10/2002 | Farnworth et al. |
| 6,465,893 B1 | 10/2002 | Khandros et al. |
| 6,473,308 B1 | 10/2002 | Forthun |
| 6,486,544 B1 | 11/2002 | Hashimoto |
| 6,489,178 B1 | 12/2002 | Coyle et al. |
| 6,489,687 B1 | 12/2002 | Hashimoto |
| 6,492,718 B1 | 12/2002 | Ohmori |
| 6,509,639 B1 | 1/2003 | Lin |
| 6,514,793 B1 | 2/2003 | Isaak |
| 6,528,870 B1 | 3/2003 | Fukatsu et al. |
| 6,552,910 B1 | 4/2003 | Moon et al. |
| 6,560,117 B1 | 5/2003 | Moon |
| 6,572,387 B1 | 6/2003 | Burns et al. |
| 6,576,992 B1 | 6/2003 | Cady et al. |
| 6,588,095 B1 | 7/2003 | Pan |
| 6,590,282 B1 | 7/2003 | Wang et al. |
| 6,600,222 B1 | 7/2003 | Levardo |
| 6,614,664 B1 | 9/2003 | Lee |
| 6,620,651 B1 | 9/2003 | He et al. |
| 6,627,984 B1 | 9/2003 | Bruce et al. |
| 6,657,134 B1 | 12/2003 | Spielberger et al. |
| 6,660,561 B1 | 12/2003 | Forthun |
| 6,677,670 B1 | 1/2004 | Kondo |
| 6,683,377 B1 | 1/2004 | Shim et al. |
| 6,690,584 B1 | 2/2004 | Uzuka et al. |
| 6,699,730 B1 | 3/2004 | Kim et al. |
| 6,707,684 B1 | 3/2004 | Andric et al. |
| 6,709,893 B1 | 3/2004 | Moden et al. |
| 6,768,660 B1 | 7/2004 | Kong et al. |
| 6,781,240 B1 | 8/2004 | Choi et al. |
| 6,803,651 B1 | 10/2004 | Chiang |
| 6,812,567 B1 | 11/2004 | Kim et al. |
| 6,833,984 B1 | 12/2004 | Belgacem |
| 6,849,949 B1 | 2/2005 | Lyu et al. |
| 6,876,074 B1 | 4/2005 | Kim |
| 6,884,653 B1 * | 4/2005 | Larson ...................... 438/107 |
| 6,891,729 B1 | 5/2005 | Ko et al. |
| 6,908,792 B1 | 6/2005 | Bruce et al. |
| 6,914,324 B1 | 7/2005 | Rapport et al. |
| 6,919,626 B1 | 7/2005 | Burns |
| 2001/0006252 A1 | 7/2001 | Kim et al. |
| 2001/0013423 A1 | 8/2001 | Datal et al. |
| 2001/0015487 A1 | 8/2001 | Forthun |
| 2001/0035572 A1 | 11/2001 | Harlan |
| 2001/0040793 A1 | 11/2001 | Inaba |
| 2002/0006032 A1 | 1/2002 | Karabatsos |
| 2002/0030995 A1 | 3/2002 | Masao |
| 2002/0048849 A1 | 4/2002 | Harlan |
| 2002/0076919 A1 | 6/2002 | Peters et al. |
| 2002/0101261 A1 | 8/2002 | Karabatsos |
| 2002/0139577 A1 | 10/2002 | Miller |
| 2002/0164838 A1 | 11/2002 | Moon et al. |
| 2002/0180022 A1 | 12/2002 | Emoto |
| 2003/0016710 A1 | 1/2003 | Satoshi |
| 2003/0045025 A1 | 3/2003 | Coyle et al. |
| 2003/0049886 A1 | 3/2003 | Salmon |
| 2003/0081392 A1 | 5/2003 | Cady et al. |
| 2003/0107118 A1 | 6/2003 | Pflughaupt et al. |
| 2003/0109078 A1 | 6/2003 | Yoshikazu et al. |
| 2003/0168725 A1 | 9/2003 | Warner et al. |
| 2004/0000708 A1 | 1/2004 | Rapport et al. |
| 2004/0021211 A1 | 2/2004 | Damberg |
| 2004/0031972 A1 | 2/2004 | Pflughaupt et al. |
| 2004/0045159 A1 | 3/2004 | DiStefano et al. |
| 2004/0065963 A1 | 4/2004 | Karnezos |
| 2004/0075991 A1 | 4/2004 | Haba et al. |
| 2004/0099938 A1 | 5/2004 | Kang et al. |
| 2004/0104470 A1 | 6/2004 | Bang et al. |
| 2004/0115866 A1 | 6/2004 | Bang et al. |
| 2004/0150107 A1 | 8/2004 | Cha et al. |
| 2004/0157352 A1 | 8/2004 | Beroz et al. |
| 2004/0203190 A1 | 10/2004 | Pflughaupt et al. |
| 2004/0217461 A1 | 11/2004 | Damberg |
| 2004/0217471 A1 | 11/2004 | Haba |
| 2004/0238931 A1 | 12/2004 | Haba et al. |
| 2004/0245617 A1 | 12/2004 | Damberg et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0133897 A1 | 6/2005 | Baek et al. |

FOREIGN PATENT DOCUMENTS

| | | |
|---|---|---|
| DE | 004214102 A1 | 12/1992 |
| EP | 0426-303 A2 | 10/1990 |
| EP | 0461-639 A2 | 12/1991 |
| EP | 1119-049 A2 | 7/2001 |
| JP | 359088863 (A) | 5/1984 |

| | | |
|---|---|---|
| JP | 60-254762 (A) | 12/1985 |
| JP | 3641047659 (A) | 9/1986 |
| JP | 62-230027 (A) | 8/1987 |
| JP | 4-209562 (A) | 7/1992 |
| JP | 4-4368167 (A) | 12/1992 |
| JP | 50-29534 (A) | 5/1993 |
| JP | 5-335695 A | 12/1993 |
| JP | 63-153849 (A) | 6/1998 |
| JP | 2-821315 B2 | 11/1998 |
| JP | 2000/307029 (A) | 11/2000 |
| JP | 2001077294 A | 3/2001 |
| JP | 2001085592 A | 3/2001 |
| JP | 2001332683 A | 11/2001 |
| JP | 2003037246 A | 2/2003 |
| JP | 2003086760 A | 3/2003 |
| JP | 2003086761 A | 3/2003 |
| JP | 2003/309247 (A) | 10/2003 |
| JP | 2003309246 A | 10/2003 |
| JP | 2003/347475 (A) | 12/2003 |
| JP | 2003/347503 (A) | 12/2003 |
| WO | WO 03/037053 A1 | 5/2003 |

OTHER PUBLICATIONS

Tessera Technologies, Inc.—Semiconductor Intellectual Property, Chip Scale Packaging—Website pages (3), Published on the Internet.

Tessera Introduces uZ ä—Ball Stacked Memory Package for Computing and Portable Electronic Products, Oyce Smaragdis, Tessere Public Relations, Sandy Skees, MCA PR (www.tessera.com/news_events/press_coverage.cfm); 2 figures that purport to be directed to the uZ ä—Ball Stacked Memory Package. Published Jul. 17, 2002, San Jose, CA.

Ron Bauer, Intel. "Stacked-CSP Delivers Flexibility, Reliability, and Space-Saving Capabilities", Spring 2002, Published on the Internet.

Tessera uZ Ball Stack Package. 4 figures that purport to be directed to the uZ—Ball Stacked Memory, Published on the Intenet.

Chip Scale Review Online—An Independent Journal Dedicated to the Advancement of Chip-Scale Electronics. (Website 9 pages) Fjelstad, Joseph, Pacific Consultants L.LC., Published Jan 2001 on the Internet.

Flexible Thinking: Examining the Flexible Circuit Tapes. (Website 2 pages) Fjelstad, Joseph., Published Apr. 20, 2000 on Internet.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

Flexible Printed Circuit Technology - A Versatile Interconnection Option. (Website 2 pages) Fjelstad, Joseph, Dec. 3, 2002.

Chip Scale Packaging and Redistribution, Paul A. Magill, Glenn A. Rinne, J. Daniel Mis, Wayne C. Machon, Joseph W. Baggs, Unitive Electronics Inc.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512X16A3, Ceramic K X 16 CMOS SRAM Module.

IBM Preliminary 168 Pin SDRAM Registered DIMM Functional Description & Timing Diagrams.

3D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Intergrated Package, Alvin Weinberg, Pacesetter, Inc. and W. Kinzy Jones, Florida International University.

1992 Proceedings, 42nd Electronic Components & Technology Conference, May 18-20, 1992.

Research Disclosure, Organic Card Device Carrier, 31318, May 1990, No.313.

IBM Technical Disclosure Bulletin, vol. 23, No. 12, May 1981.

IBM Technical Disclosure Bulletin, vol. 20 No. 11A, Apr. 1978.

IBM Technical Disclosure Bulletin, vol. 32, No.3B, Aug. 1989.

Orthogonal Chip Mount- A 3D Hybird Water Scale Integration Technology, International Electron Device Meeting, IEDM Technical Digest, Washington, D.C., Dec. 6-9, 1987.

William R. Newberry, Design Techniques for Ball Grid Arrays, Xynetix Design Systems, Inc., Portland, Maine, Published on the Internet.

Tessera Technologies, Inc.- Semiconductor Intellectual Property, Chip Scale Packaging - Website pages (3), Published on Internet.

Tessera Introduces uZ ä - Ball Stacked Memory Package for Computing and Portable Electronic Products, Oyce Smaragdis, Tessera Public Relations, Sandy Skees, MCA PR (www.tessera.com/news_ events/press_coverage.cfm); 2 figures that purport to be directed to the uZ ä - Ball Stacked Memory Package. Published Jul. 17, 2002, San Jose, CA.

Ron Bauer, Intel. "Stacked-CSP Delivers Flexibility, Reliability, and Space-Saving Capabilities", Spring 2002, Published on the Internet.

Tessera uZ Ball Stack Package. 4 figures that purport to be directed to the uZ - Ball Stacked Memory, Published on the Internet.

Chip Scale Review Online - An Independent Journal Dedicated to the Advancement of Chip-Scale Electronics. (Webiste 9 pages) FJELSTAD, Joseph, Pacific Consultants L.L.C., Published Jan 2001 on Internet.

Flexible Thinking: Examining the Flexible Circuit Tapes. (Website 2 pages) FJELSTAD, Joseph., Published Apr. 20, 2000 on Internet.

Die Products: Ideal IC Packaging for Demanding Applications - Advanced packaging that's no bigger than the die itself brings together high performance and high reliability with small size and low cost. (Website 3 pages with 2 figures) Larry Gilg and Chris Windsor. Dec. 23, 2002. Published on Internet.

* cited by examiner

| | JEDEC Pinout for the X4 and X8 FBGA DDR-II Package | | | | Reference | | | |
|---|---|---|---|---|---|---|---|---|
| | 1 | 2 | 3 | 4 | 5 | 6 | 7 | 8 | 9 |
| A | VDD | NU,RDQS# | VSS | X | X | X | VSSQ-S | DQS# | VDDQ |
| B | NC/DQ | VDDQ | DM/RDQS | X | X | X | DQS | VDDQ-S | NC/DQ |
| C | VDDQ | DQ | VSSQ | X | X | X | VSSQ | DQ | VDDQ |
| D | NC/DQ | VSSQ | DQ | X | X | X | DQ | VSSQ | NC/DQ |
| E | VSSDL | VREF | VDDL | X | X | X | VDD | CK | VSS |
| F | X | WE# | CAS | X | X | X | RAS# | CK | X |
| G | X | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | X | X | X | A15 | A13 | X |

FIG. 8

X8 Configuration 2Hi Using 2 x 4 parts — 8 Data Out

|   | 1 | 2 | 3 | 4 | 5 | 6 | 7 | 8 | 9 |
|---|---|---|---|---|---|---|---|---|---|
| A | VDD | NU,RDQS# | VSS | X | X | X | VSSQ-S | DQS# | VDDQ |
| B | DQ top | VDDQ | DM/RDQS | X | X | X | DQS | VDDQ-S | DQ top |
| C | VDDQ | DQ bot | VSSQ | X | X | X | VSSQ | DQ bot | VDDQ |
| D | DQ top | VSSQ | DQ bot | X | X | X | DQ bot | VSSQ | DQ top |
| E | VSSDL | VREF | VDDL | X | X | X | VDD | CK | VSS |
| F | NC | WE# | CAS | X | X | X | RAS# | CK | X |
| G | NC | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | X | X | X | A15 | A13 | X |

FIG. 9

| X16 Configuration 2Hi Using 2 x 8 parts | | | 16 Data Out | | | | | |
|---|---|---|---|---|---|---|---|---|
| | 1 | 2 | 3 | 4 | 5 | 6 | 7 | 8 | 9 |
| A | VDD | RDQS# | VSS | RDQS0#/DM0/RDQS1 | X | DQS1# | VSSQ-S | DQS0# | VDDQ |
| B | DQ top | VDDQ | DM1/RDQS | DQS1 | X | DQS1 | DQS0 | VDDQ-S | DQ top |
| C | VDDQ | DQ top | VSSQ | DQ BOT | X | DQ BOT | VSSQ | DQ top | VDDQ |
| D | DQ top | VSSQ | DQ top | DQ BOT | X | DQ BOT | DQ top | VSSQ | DQ top |
| E | VSSDL | VREF | VDDL | DQ BOT | X | DQ BOT | VDD | CK | VSS |
| F | NC | WE# | CAS | X | X | X | RAS# | CK | X |
| G | NC | CS# | CKE | X | X | X | BA1# | BA0 | X |
| H | VSS | A10 | A1 | X | X | X | A2 | A0 | VDDQ |
| J | X | A3 | A5 | | X | | A6 | A4 | X |
| K | X | A7 | A9 | | X | | A11 | A8 | VSS |
| L | VDD | A12 | A14 | | X | | A15 | A13 | X |

FIG. 10

PITCH CHANGE AND CHIP SCALE STACKING SYSTEM

CROSS REFERENCE TO RELATED APPLICATIONS

This application is a continuation-in-part of U.S. patent application Ser. No. 10/005,581 filed Oct. 29, 2001, now U.S. Pat. No. 6,576,992. This application is also a continuation-in-part of U.S. patent application Ser. No. 10/453,398, filed Jun. 3, 2003, pending, which application is a continuation-in-part of U.S. patent application Ser. No. 10/005,581 filed Oct. 29, 2001, now U.S. Pat. No. 6,576,992.

TECHNICAL FIELD

The present invention relates to aggregating integrated circuits and, in particular, to stacking integrated circuits in chip-scale packages.

BACKGROUND OF THE INVENTION

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packaging or CSP have recently gained market share.

CSP refers generally to packages that provide connection to an integrated circuit through a set of contacts arrayed across a major surface of the package. Instead of leads emergent from a peripheral side of the package, contacts are placed on a major surface and typically emerge from the planar bottom surface of the package. The absence of "leads" on package sides renders most stacking techniques devised for leaded packages inapplicable for CSP stacking.

The previous known methods for stacking CSPs apparently have various deficiencies including complex structural arrangements and thermal or high frequency performance issues. Thermal performance is a characteristic of importance in CSP stacks. To increase dissipation of heat generated by constituent CSPs, the thermal gradient between the lower CSP and upper CSP in a CSP stack or module should be minimized. Prior art, solutions to CSP stacking do not, however, address thermal gradient minimization in disclosed constructions.

As CSP gains in market share, signal complexity and datapath widths reflect the growing trend toward moving ever larger amounts of data at increasing rates and the demand for wider datapath storage increases.

What is needed, therefore, is a technique and system for stacking chipscale packaged integrated circuits in a module that provides a thermally efficient, reliable structure that performs well at higher frequencies and provides datapath flexibility but does not result in a stack of excessive height yet allows production at reasonable cost with readily understood and managed materials and methods.

SUMMARY OF THE INVENTION

The present invention stacks chip scale-packaged integrated circuits (CSPs) into modules that conserve PWB or other board surface area. The present invention can be used to advantage with CSP packages of a variety of sizes and configurations. Although the present invention is applied most frequently to chip scale packages that contain one die, it may be employed with chip scale packages that include more than one integrated circuit die.

In a two-high CSP stack or module devised in accordance with a preferred embodiment of the present invention, two CSPs are stacked, with one CSP disposed above the other. The two CSPs are connected with a flex circuitry. The flex circuitry connects the upper and lower CSPs and provides a thermal and electrical path connection path between the module and an application environment such as a printed wiring board (PWB). Supplemental contacts on the module provide connectivity for additional signaling and/or datapath and/or control.

The present invention may be employed to advantage in numerous configurations and combinations of CSPs in modules provided for high-density memories or high capacity computing.

SUMMARY OF THE DRAWINGS

FIG. 8 illustrates a JEDEC pinout for DDR-II FBGA packages.

FIG. 9 illustrates the pinout of a module 10 in an alternative embodiment of the invention.

FIG. 10 illustrates the pinout of a module 10 in an alternative embodiment of the invention.

DESCRIPTION OF PREFERRED EMBODIMENTS

Figure 1:
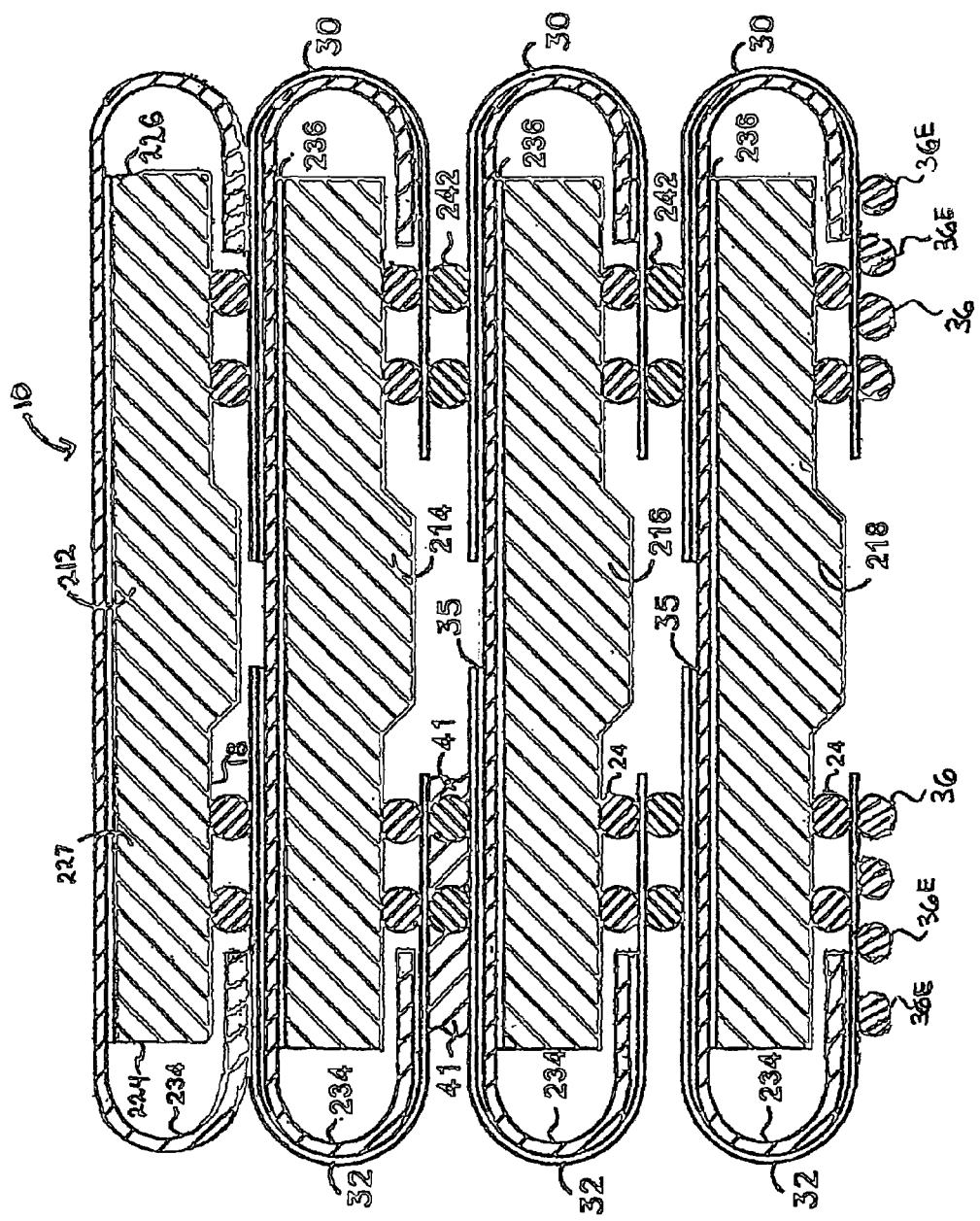
FIG. 1 is an elevation view of a high-density circuit module devised in accordance with a preferred four-high embodiment of the present invention.

FIG. 1 is an elevation view of module 10 devised in accordance with a preferred embodiment of the present invention. Module 10 is comprised of four CSPs: level four CSP 212, level three CSP 214, level two CSP 216, and level one CSP 218. Each of the CSPs has an upper surface 16 and a lower surface 18 and opposite lateral edges 224 and 226 and typically include at least one integrated circuit surrounded by a plastic body 227. The body need not be plastic, but a large majority of packages in CSP technologies are plastic. Those of skill will realize that the present invention may be devised to create modules with different size CSPs and that the constituent CSPs may be of different types within the same module 10. For example, one of the constituent CSPs may be a typical CSP having lateral edges 224 and 226 that have an appreciable height to present a "side" while other constituent CSPs of the same module 10 may be devised in packages that have lateral edges 224 and 226 that are more in the character of an edge rather than a side having appreciable height.

Figure 2:
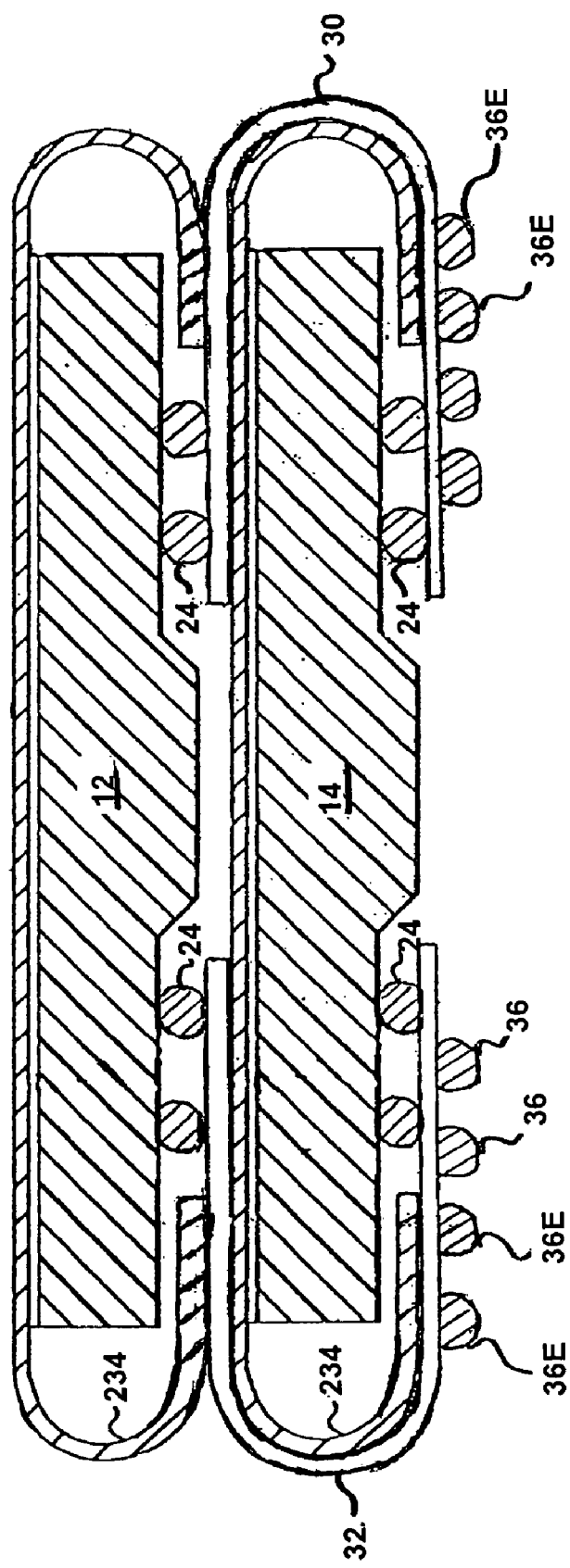
FIG. 2 depicts another preferred embodiment of the present invention having supplemental rows of module contacts disposed toward the periphery of the module.

The invention is used with CSP packages and packaged integrated circuits of a variety of types and configurations such as, for example, those that are die-sized, as well those that are near chip-scale as well as the variety of ball grid array packages known in the art. It may also be used with those CSP-like packages that exhibit bare die connectives on one major surface. Thus, the term CSP should be broadly considered in the context of this application. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views of FIGS. 1 and 2 are depicted with CSPs of a particular profile known to those in the art, but it should be understood that the figures are exemplary only. The invention may be employed to advantage in the wide range of CSP configurations available in the art where an array of connective elements is available from at least one major surface. The invention is advantageously employed with CSPs that contain memory circuits, but may be employed to advantage with logic and computing circuits where added capacity without commensurate PWB or other board surface area consumption is desired.

Typical CSPs, such as, for example, ball-grid-array ("BGA"), micro-ball-grid array, and fine-pitch ball grid array ("FBGA") packages have an array of connective contacts embodied, for example, as leads, bumps, solder balls, or balls that extend from lower surface 18 of a plastic casing in any of several patterns and pitches. An external portion of the connective contacts is often finished with a ball of solder. Shown in FIG. 1 are contacts 24 along lower surfaces 18 of the illustrated constituent CSPs 212, 214, 216, and 218. Contacts 24 provide connection to the integrated circuit or circuits within the respective packages. In embodiments of the present invention, module 10 may be devised to present a lower profile by stripping from the respective CSPs, the balls depicted in FIG. 1 as contacts 24 and providing a connection facility at contact 24 that results from solder paste that is applied either to the pad contact of the CSP that is typically present under or within the typical ball contacts provided on CSP devices or to the contact sites on the flex circuitry to be connected to contact 24.

In FIG. 1, iterations of flex circuits ("flex", "flex circuits" or "flexible circuit structures") 30 and 32 are shown connecting various constituent CSPs. Any flexible or conformable substrate with an internal layer connectivity capability may be used as a flex circuit in the invention. The entire flex circuit may be flexible or, as those of skill in the art will recognize, a PCB structure made flexible in certain areas to allow conformability around CSPs and rigid in other areas for planarity along CSP surfaces may be employed as an alternative flex circuit in the present invention. For example, structures known as rigid-flex may be employed. Form standard 234 is shown disposed adjacent to upper surface 16 of each of the CSPs. Form standard 234 may be fixed to upper surface 16 of the respective CSP with an adhesive 236 which preferably is thermally conductive. Form standard 234 may also, in alternative embodiments, merely lay on upper surface 16 or be separated from upper surface 16 by an air gap or medium such as a thermal slug or non-thermal layer. However, where form standard 234 is a thermally conductive material such as the copper that is employed in a preferred embodiment, layers or gaps interposed between form standard 234 and the respective CSP (other than thermally conductive layers such as adhesive) are not highly preferred.

Form standard 234 is, in a preferred embodiment, devised from copper to create a mandrel that mitigates thermal accumulation while providing a standard-sized form about which flex circuitry is disposed. Form standard 234 may take other shapes and forms such as for example, an angular "cap" that rests upon the respective CSP body. It also need not be thermally enhancing although such attributes are preferable. The form standard 234 allows the invention to be employed with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32) may be devised and used with the form standard 234 method and/or systems disclosed herein to create stacked modules with CSPs having different sized packages. This will allow the same flexible circuitry set design to be employed to create iterations of a stacked module 10 from constituent CSPs having a first arbitrary dimension X across attribute Y (where Y may be, for example, package width), as well as modules 10 from constituent CSPs having a second arbitrary dimension X prime across that same attribute Y. Thus, CSPs of different sizes may be stacked into modules 10 with the same set of connective structures (i.e. flex circuitry). Further, as those of skill will recognize, mixed sizes of CSPs may be implemented into the same module 10, such as would be useful to implement embodiments of a system-on-a-stack such as those disclosed in co-pending application U.S. patent application Ser. No. 10/136,890.

Preferably, portions of flex circuits 30 and 32 are fixed to form standard 234 by adhesive 35 which is preferably a tape adhesive, but may be a liquid adhesive or may be placed in discrete locations across the package. Preferably, adhesive 35 is thermally conductive. In some embodiments, adhesive 35 may be an inter-metallic bond and may have a melting point higher than typical reflow temperatures encountered in subsequent reflow operations. Adhesive 35 ("metallic bond 35", "bond 35") is preferably devised to provide for optimal thermal conductivity between flex circuits 30 and 32 and form standards 234.

Further, heat transference can be improved with use of a form standard 234 comprised of heat transference material such as a metal or preferably, copper or a copper compound or alloy to provide a significant sink for thermal energy. Such thermal enhancement of module 10 particularly presents opportunities for improvement of thermal performance where larger numbers of CSPs are aggregated in a single stacked module 10.

In a preferred embodiment, flex circuits 30 and 32 are multi-layer flexible circuit structures that have at least two conductive layers examples of which are described with regard to later-referenced Figures. Other embodiments may, however, employ flex circuitry, either as one circuit or two flex circuits to connect a pair of CSPs, that have only a single conductive layer.

Preferably, the conductive layers are metal such as alloy 110. The use of plural conductive layers provides advantages and the creation of a distributed capacitance across module 10 intended to reduce noise or bounce effects that can, particularly at higher frequencies, degrade signal integrity, as those of skill in the art will recognize. Module 10 of FIG. 1 has plural module contacts 36 and supplemental module contacts 36E. In this embodiment, form standard 234 extends underneath CSP 218 in a manner devised to provide support and/or thermal connectivity to supplemental module contacts 36E. Connections between flex circuits are shown as being implemented with inter-flex contacts 242 which are shown as balls but may be low profile contacts constructed with pads and/or rings that are connected with solder paste applications to appropriate connections. Appropriate optional fills such as those indicated by conformal media reference 41 can provide added structural stability and coplanarity where desired. Media 41 is shown only as to CSPs 214 and 216 and only on one side to preserve clarity of view.

FIG. 2 depicts another embodiment of the present invention having supplemental rows of module contacts 36E that are, in this embodiment, disposed toward the periphery of module 10. In this embodiment, CSPs 12 and 14 are shown in a stacked arrangement, each having a form standard 234. In this embodiment, each form standard 234 extends underneath the respective CSP in a manner devised to provide extended surface area to facilitate heat transfer from flex circuitry 30 and 32 and/or in a manner devised to provide support of supplemental module contacts 36E. Supplemental module contacts 36E ("supplemental contacts", "extra contacts") are shown connected to flex circuitry 30 and 32. Supplemental contacts 36E are devised to provide extra input/output signal paths and connectivity for the depicted CSPs in module 10. For example, in some embodiments, supplemental contacts 36E will provide a signal path enabling the combination of more than one datapath of 'n' bits from respective CSPs of module 10 into a combined datapath of 2-n bits, 3-n bits, 4-n bits, or more. Supplemental contacts may also provide connectivity for signals such as chip enable signals, address lines, timing signals such as, for example, strobe signals, or various other input/output and signaling connectivity that may be required for applications such as memory, FPGA's, or other types of high-density circuit modules.

Figure 7:
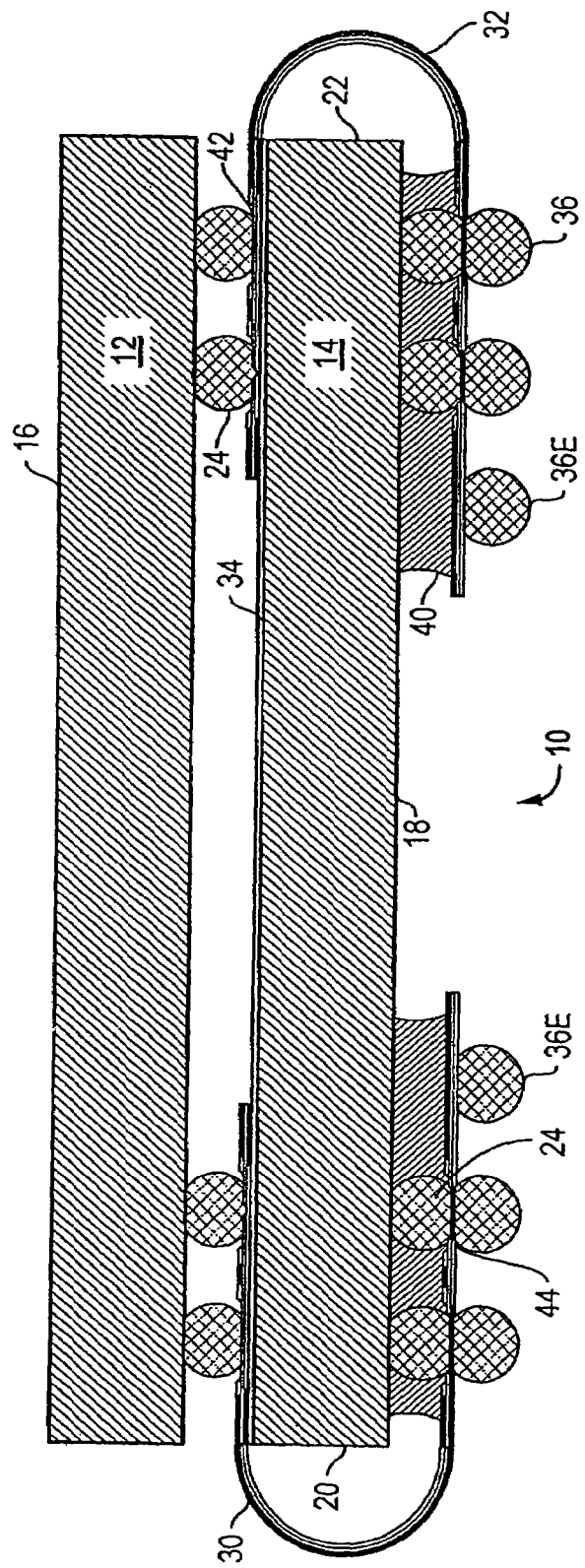
FIG. 7 depicts an alternative embodiment of the present invention.

Extra contacts 36E are depicted as solder balls, but this is not limiting and extra contacts 36E may take other forms of chipscale contacts, such as, for example, plated bumps, solder bumps, and balls. Further, module and extra contacts 36 and 36E may be solder balls having a circumference smaller or larger than CSP contacts 24. In this embodiment, module contacts 36 and extra contacts 36E are disposed in a pattern offset from the pattern of CSP contacts 24 of CSP 14. For example, in this depicted embodiment, the first row of extra contacts 36E is disposed between and below the two rows of CSP contacts 24 of lower CSP 14. Extra contacts 36E are depicted in extra rows disposed in a direction toward the periphery of module 10 from module contacts 36 and CSP contacts 24. However, this is not limiting and extra contacts 36E may be disposed toward the center of the bottom surface of CSP 14 as depicted in FIG. 7, and/or grouped within the "footprint" of CSP contacts 24 in a manner devised to lower the pitch and/or size of module contacts 36 and extra contacts 36E.

Figure 3:
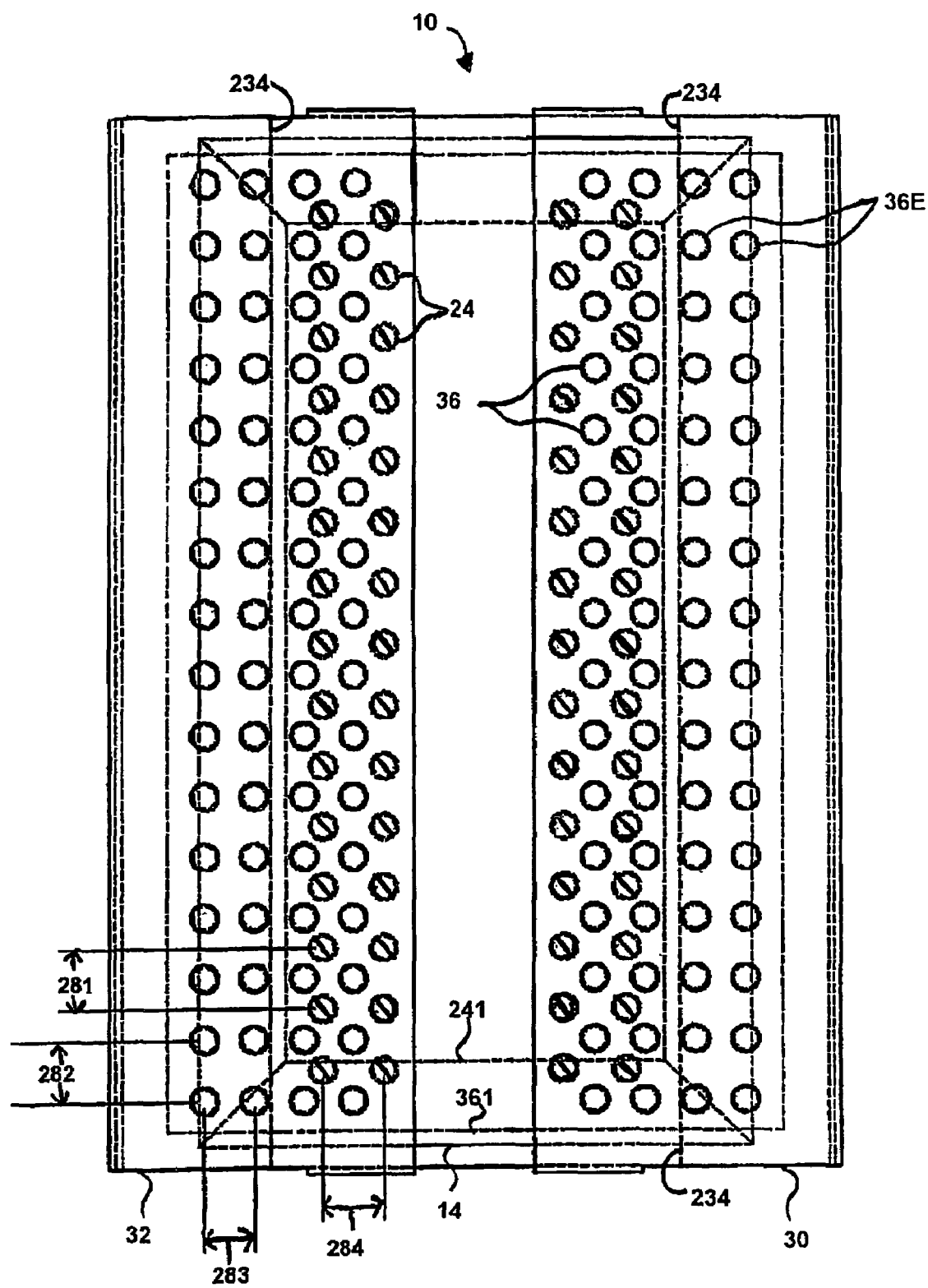
FIG. 3 is a bottom overlay view of another embodiment of the present invention.

FIG. 3 is a bottom overlay view of another embodiment of the present invention. Module 10 is depicted in a transparent overlay view showing the periphery of CSP 14 marked by a dotted rectangle referenced 14. CSP contacts 24 are depicted as circles crossed with a diagonal hatch mark. Dotted rectangle 361 surrounds the arrays of module contacts 36 and supplemental module contacts 36E, both of which module contacts are depicted as circles having no hatch mark. While in this embodiment CSP contacts 24 and module supplemental contacts 36 and 36E are arranged in two arrays separated by a distance in the middle, this is not limiting and CSP contacts or module contacts may be arranged in many ways, such as, for example, one array of rows and columns, a pattern of rows and columns about the periphery of the overlay, or various other patterns. The arrangements of contacts is referenced in FIG. 3 as having rows extending along an elongated lateral dimension of the module or CSP (rows are vertical in FIG. 3), and columns extending along the smaller lateral dimension (columns are horizontal in FIG. 3). However, this is only for convenience of description and various embodiments may include CSPs or modules having square outlines or various other shapes with corresponding differences in the arrangements of contacts.

In this embodiment, CSP contacts 24 have a column pitch 284, measured from center-to-center of CSP contacts in adjacent rows. CSP contacts 24 may be further described by a row pitch 281, measured from center-to-center of CSP contacts adjacent to each other in the same row. In this embodiment, module contacts 36 and supplemental contacts 36E have a column pitch 283, measured from center-to-center of CSP contacts adjacent to each other within a column. Module contacts 36 and supplemental contacts 36E may be further described by a row pitch 282, measured from center-to-center of CSP contacts adjacent to each other within a row. In this embodiment, row pitch 281 is equal to row pitch 282. However, in other embodiments, row pitch 282 may be less than or greater than column pitch 281. In this embodiment, column pitch 283 is 0.8 mm, which is 0.2 mm smaller than column pitch 284 of 1 mm. Other embodiments may have other smaller or larger pitches for rows or columns. For example, as is known in the art, contacts arranged about the periphery of devices frequently have smaller pitches than similarly-sized contacts arranged in arrays. Further, in other embodiments, module and supplemental contacts 36 and 36E may be smaller or larger than CSP contacts 24, although here they are depicted as being similarly-sized.

In this embodiment, module contacts 36 and supplemental contacts 36E have one more column of contacts than do CSP contacts 24. Module and supplemental contacts 36 and 36E are arranged in an offset position devised to place the arrays of contacts having an extra column at the center with regard to the longitudinal dimension flex circuitry 30 and 32. While in this embodiment, module and supplemental contacts 36 and 36E have four extra rows and are offset, in other embodiments there may be more or fewer rows arranged in other offset positions or non-offset positions. Further, other embodiments may present a contact footprint having an area equal to or smaller than the footprint of module contacts 24 including some or all of supplemental contacts 36E by reducing pitch 282 and/or reducing the size of module and supplemental contacts 36 and 36E. Such arrangements, and various other embodiments including those described herein, may be devised to connect module 10 to various operating environments, such as, for example, DIMM memory boards, embedded systems like cellular phones and other personal electronics, circuit boards and modules, and many other systems requiring densely integrated CSPs.

In this embodiment, there are two rows of supplemental contacts 36E in each of the depicted arrays, in addition to the one extra column described above. The outside row of supplemental contacts 36E on each side is depicted as extending slightly beyond the lateral extent of CSP 14. In other embodiments, there may be rows of supplemental contacts 36E wholly outside the lateral extent of CSP 14, or all the supplemental contacts 36E may be inside the lateral extent of CSP 14. A lower portion of form standard 234 is depicted having an interior edge on each side marked by the dotted lines referenced 234. This position is devised to place form standard 234 above supplemental contacts 36E for mechanical support and thermal conduction. In other embodiments, form standard 234 may not extend over supplemental contacts 36E, or may extend only partially over supplemental contacts 36E or may extend further under CSP 14 and surround or penetrate the arrays of CSP contacts 24. Still other embodiments may be practiced without a form standard 234.

Figure 4:
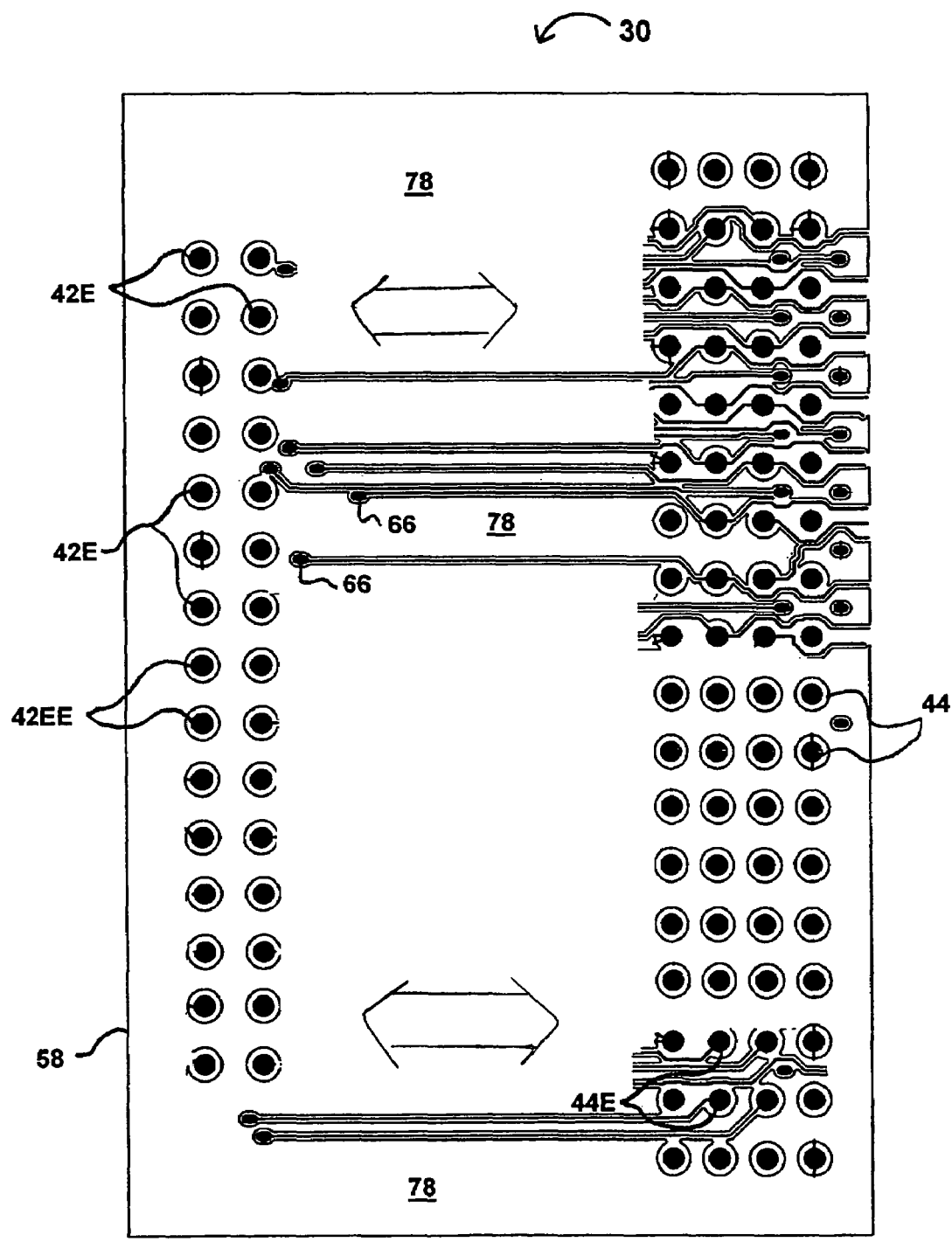
FIG. 4 depicts a second conductive layer according to another preferred two-high embodiment of the present invention.
Figure 5:
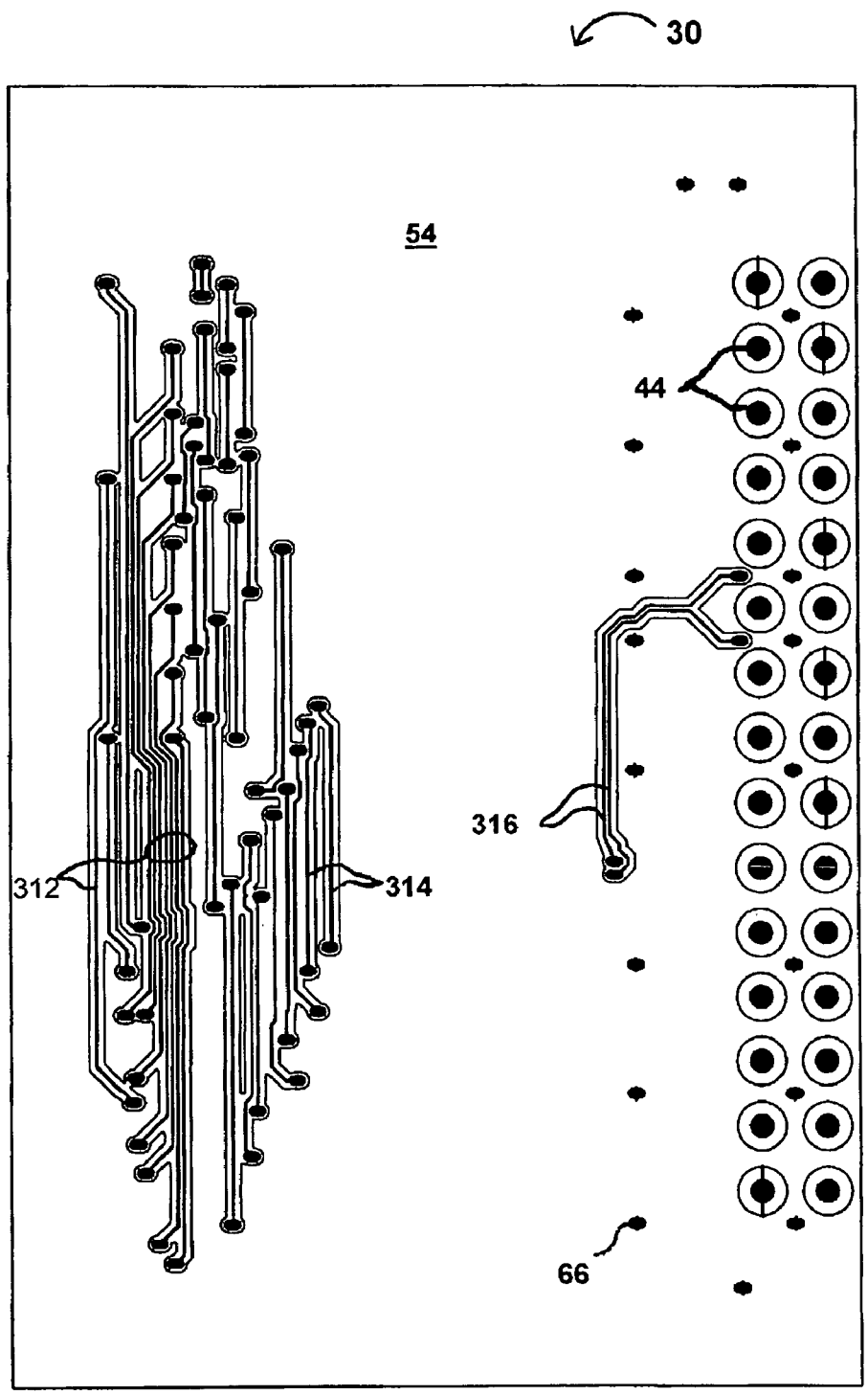
FIG. 5 depicts a first conductive layer devised to cooperate with the second conductive layer depicted in FIG. 4 according to another preferred embodiment of the present invention.

FIG. 4 depicts a second conductive layer 58 of a flex 30 according to another preferred two-high embodiment of the present invention. In this embodiment, flex 30 connects CSPs 12 and 14 by connecting those CSP contacts which are on the left side of a top-view ballout diagram. The description with reference to FIGS. 4 and 5 is from the top perspective. As with the embodiment described with reference to FIGS. 12–13, in this embodiment, second conductive layer 58 is disposed in the lower, outside wrapped position as compared with first conductive layer 54. In the alternative preferred embodiment for which second conductive layer 58 is shown in FIG. 4, module contacts 36 and 36E contact appropriate lower flex contacts 44. Those of skill will recognize that lower flex contacts 44E are connected to corresponding upper flex contacts 42E to provide a datapath for connecting, in this embodiment, a selected 9-bit portion of the 18-bit datapath from the upper CSP 12 to the module and supplemental contacts 36 and 36E. Portions of the various connections and traces are not shown in FIG. 4 to preserve clarity of view, however, those having skill in the art are familiar with making such traces. Portions of such connections are made through vias 66 and traces 312 depicted in FIG. 5. Conductive layer 58 of flex 30 contains Vdd plane 78, which in some embodiments may be paired with a similarly-positioned ground plane on first conductive layer 54 (an example of which is depicted in FIG. 4) to provide advantageous high-frequency signaling characteristics as described with above-referenced Figures. CSP contacts 24 of upper CSP 12 that convey data are in contact with upper flex contacts 42E. Consequently, the datapaths of both upper CSP 12 and lower CSP 14 are combined to provide a wide datapath on module 10. Other contacts, such as upper flex contacts 42EE provide connectivity for control and reference data. In one preferred embodiment, the UDS and LDS data strobe signals in the FCRAM scheme are provided by flex 30 on the DS contacts of upper CSP 12 and lower CSP 14, respectively. Those of skill will understand a similar arrangement may be made for UDQ and LDQ signals on a flex 32 disposed to connect the opposite, right-side contacts of the constituent CSPs 12 and 14 to module contacts 36 and 36E. Such connection may be in a manner conforming to a standard ballout configuration, or may be a different configuration devised with other design considerations in mind.

Those having skill in the art will understand, after appreciating this specification, that contacts 42E in this embodiment are devised in a manner providing a module footprint compliant with a ball-out for a common x36 FCRAM CSP. In this embodiment, the flex 30 provides, together with a similarly-devised flex 32 on the opposing lateral side of the module, connections to provide for combining the 18-bit datapath on two x18 FCRAM CSPs into an x36 datapath. Such an embodiment may have adjusted column pitches such as those described with reference to FIG. 4. One preferred embodiment provides such an adjusted column pitch from 1 mm to 0.8 mm. Other embodiments may provide other schemes for accessing memory capacity in the stacked CSPs, such as, for example, an x72 FCRAM capability combining datapaths of two x36 FCRAM CSPs, and other stacks of two or three or more CSPs providing increased memory capacity and/or wider data paths for various memory standards or other non-memory applications such as FPGA's or stacks with mixed types of CSPs or mixed leaded, CSP, flip-chip, and other package types. Flex 30 may also include an index indication mark for use in properly discerning the orientation and/or alignment of module 10 as is present on a lower surface of many common CSPs.

FIG. 5 depicts a first conductive layer 54 devised to cooperate with the second conductive layer 58 depicted in FIG. 4. Layer 54 is covered largely by a conductive metal layer having the reference 54, which layer in a preferred embodiment is kept at ground or Vss potential and provides, together with second conductive layer 58 and an intermediate layer 56, a distributed capacitance favorable for high frequency operation. In this embodiment, second conductive layer 58 expresses selected lower flex contacts 44, which connect flex 30 to lower CSP 14. In this embodiment, the lower flex contacts 44 depicted in FIG. 5 are offset from those expressed by second conductive layer 58 depicted in FIG. 4 and appropriate connections and interconnections are made by various traces and vias 66 depicted in FIGS. 4 and 5. Traces 314 and connected vias provide conductive paths from selected lower flex contacts 44 to selected module and supplemental contacts 36 and 36E to provide a datapath for connecting, in this embodiment, a selected 9-bit datapath from the lower CSP 14 to the module and supplemental contacts 36 and 36E. Certain embodiments of the invention which are devised to match the ballout pattern of module 10 with selected FCRAM industry ballouts will provide on flex 30 connections for data signals DQ9–DQ17 from lower CSP 14 and connections for data signals DQ9–DQ17 from upper CSP 12. Flex 30 connects such data signals to module contacts positioned to provide, in a combined 36-bit datapath, signals DQ9–DQ17 and signals DQ18–DQ26, respectively. Such data signals are present on the left side of certain FCRAM ballout patterns. As those having skill in the art will recognize from this description, this embodiment will connect, on a corresponding flex 32 on the right-hand side of this preferred 2-high stack, data signals DQ0–DQ8 of both the upper and lower CSPs 12 and 14 to data signals DQ0–DQ8 and DQ27–DQ35 of the FCRAM x36 ballout pattern presented by module and supplemental contacts 36 and 36E. Those having skill in the art will understand, after appreciating this specification, how flexes 30 and 32, in this embodiment, carry other FCRAM signals such as, for example, the clock and inverted clock signals carried by traces 316 and chip enable and power signals carried by other depicted traces.

While a two-high stack having FCRAM x18 to x36 datapath conversion has been described, other embodiments may have more CSPs, and may combine different types of CSPs or combine memory CSPs with different sizes and operating standards. Only certain embodiments will need the split datapath scheme described with reference to FIGS. 4 and 5. Other embodiments may use a single flex circuit connecting respective pairs of CSPs and thus may provide signals that cross between respective arrays of contacts on right and left sides of the stacked CSPs. Still other embodiments may stack CSPs having peripheral arrays of contacts or having filled arrays of contacts or arrays modified by methods such as those examples found in co-pending U.S. patent application Ser. Nos. 10/631,886 and 10/457,608.

Figure 6:
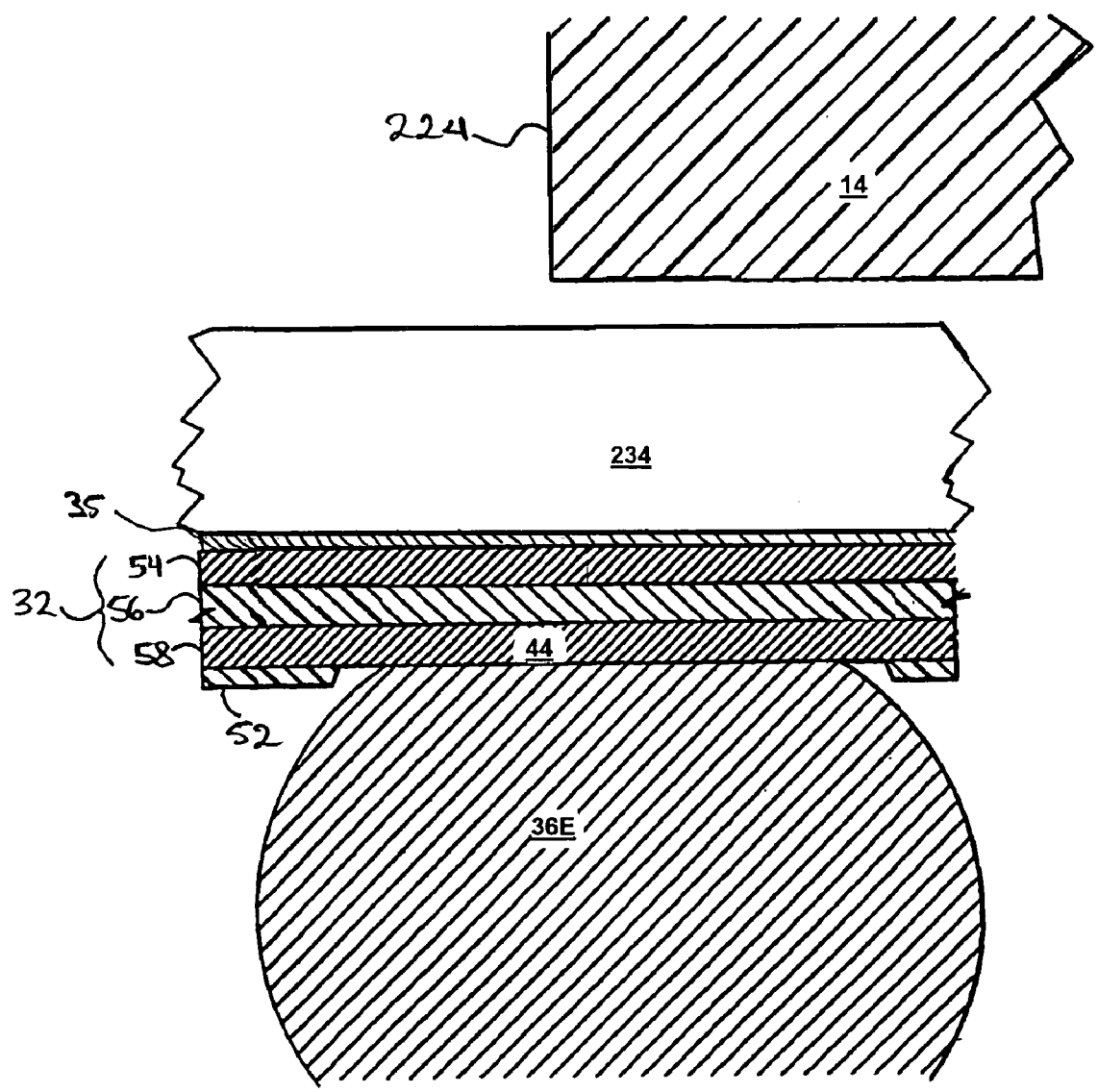
FIG. 6 depicts an enlargement of a lower flex contact according to another embodiment of the present invention.

FIG. 6 is a cross-sectional view of a portion of a preferred embodiment depicting a preferred construction for flex circuitry which, in the depicted embodiment is, in particular, flex circuit 32 which comprises two conductive layers 54 and 58 separated by intermediate layer 56. Preferably, the conductive layers are metal such as alloy 110. Optional outer layer 52 is shown over second conductive layer 58 and, as those of skill will recognize, other additional layers may be included in flex circuitry employed in the invention, such as a protective inner layer over conductive layer 54, for example. Flex circuits that employ only a single conductive layer such as, for example, those that employ only a layer such as conductive layer 58 may be readily employed in embodiments of the invention. The use of plural conductive layers provides, however, advantages and the creation of a distributed capacitance across module 10 intended to reduce noise or bounce effects that can, particularly at higher frequencies, degrade signal integrity, as those of skill in the art will recognize. In the depicted preferred embodiment, flex contact 44 at the level of second conductive layer 58 provides a contact site to allow connection supplemental module contact 36E. Form standard 234 is seen in the depiction of FIG. 6 attached to conductive layer 54 of flex circuit 32 with metallic bond 35. In this embodiment, form standard 234 extents underneath CSP 14 into the lateral extent of CSP 14, as determined by lateral edge 224, to be positioned above the depicted supplemental contact 36E in a manner devised to provide structural support and heat conductive contact with flex circuit 32 and, through it, supplemental contact 36E.

FIG. 7 depicts another alternative embodiment of the present invention showing module 10. Module contacts 36E supply a part of the datapath of module 10 and may provide a facility for differential enablement of the constituent CSPs. A module contact 36E not employed in wide datapath provision may provide a contact point to supply an enable signal to differentially enable upper CSP 12 or lower CSP 14.

In a wide datapath module 10, the data paths of the constituent upper CSP 12 and lower CSP 14 are combined to provide a module 10 that expresses a module datapath that is twice the width of the datapaths of the constituent CSPs in a two-high module 10. The preferred method of combination is concatenation, but other combinations may be employed to combine the datapaths of CSPs 12 and 14 on the array of module contacts 36 and 36E.

As an example, FIGS. 8, 9 and 10 are provided to illustrate using added module contacts 36E in alternative embodiments of the present invention to provide wider datapaths for module 10 than are present in constituent CSPs 12 and 14. FIG. 8 illustrates a JEDEC pinout for DDR-II FBGA packages. FIG. 9 illustrates the pinout provided by module contacts 36 and 36E of a module 10 expressing an 8-bit wide datapath. Module 10 is devised in accordance with the present invention and is, in the exemplar embodiment, comprised of an upper CSP 12 and lower CSP 14 that are DDR-II-compliant in timing, but each of which are only 4 bits wide in datapath. For example, FIG. 9 depicts DQ pins differentiated in source between upper CSP 12 ("top") and lower CSP 14 ("bot") to aggregate to 8-bits. Module 10 is devised in accordance with the present invention and is, in this exemplar embodiment, comprised of an upper CSP 12 and lower CSP 14 that are DDR-II-compliant in timing, but each of which are only 8-bits wide in datapath. Those of skill in the art will recognize that the wide datapath embodiment may be employed with any of a variety of CSPs available in the field and such CSPs need not be DDR compliant.

Figure 11:
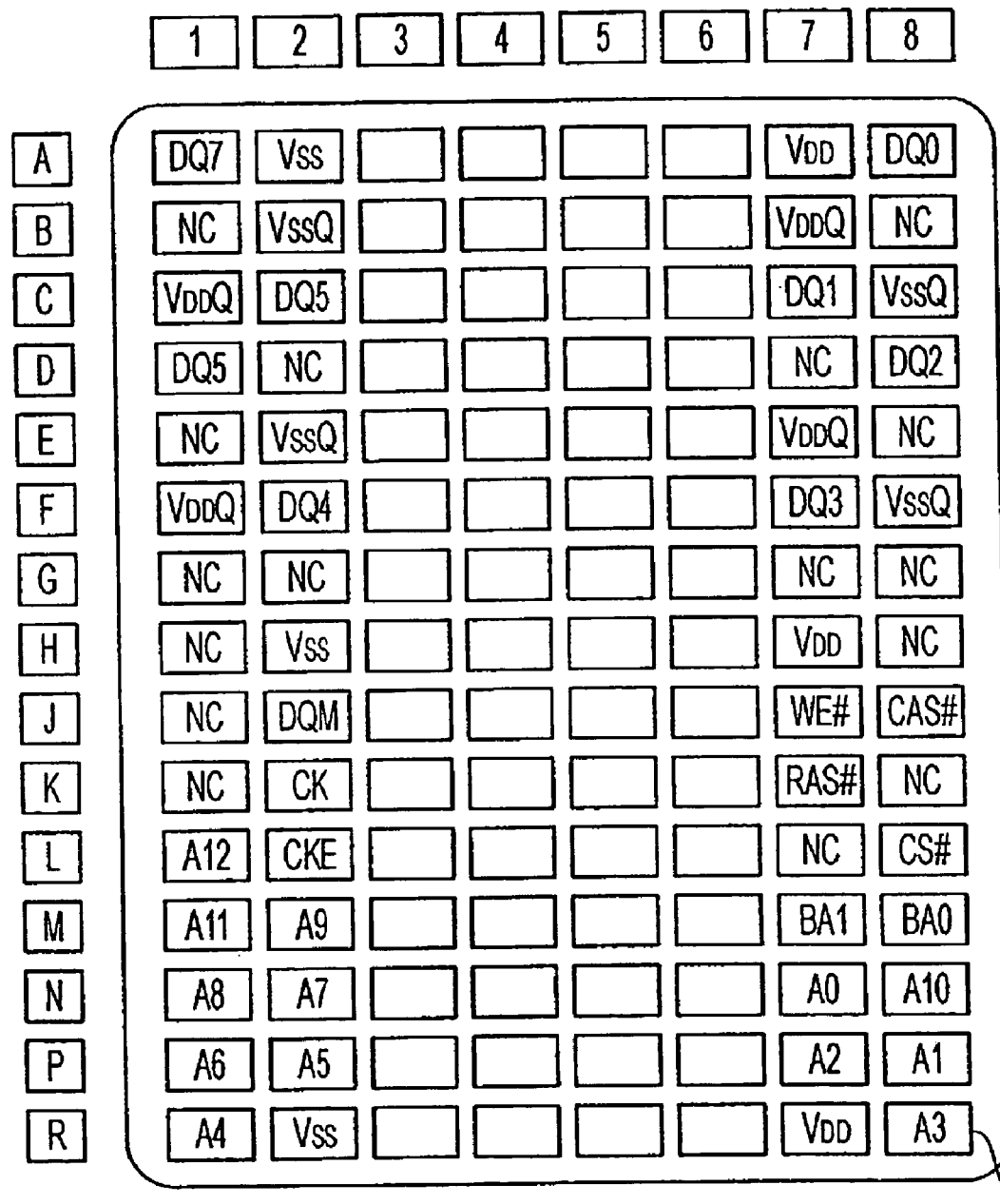
FIG. 11 depicts the pinout of an exemplar CSP employed in a embodiment of the invention.
Figure 12:
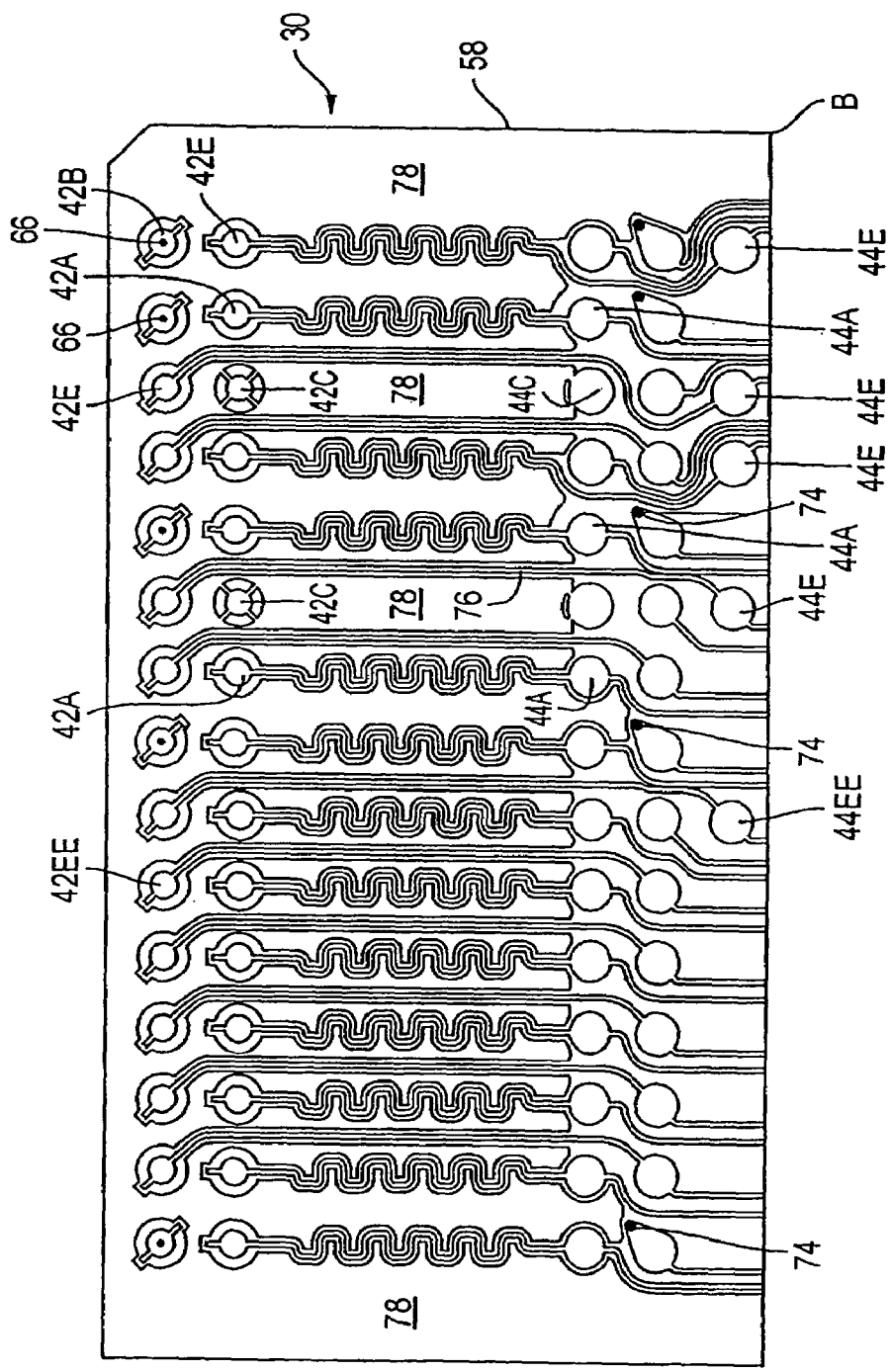
FIG. 12 depicts a second conductive layer of a flex circuit employed in an alternative embodiment of the present invention.

FIG. 11 illustrates a typical pinout of a memory circuit provided as a CSP and useable in the present invention. Individual array positions are identified by the JEDEC convention of numbered columns and alphabetic rows. The central area (e.g., A3–A6; B3–B6; etc.) is unpopulated. CSP contacts 24 are present at the locations that are identified by alpha-numeric identifiers such as, for example, A3, shown as an example CSP contact 24. FIG. 12 depicts second metal layer 58 of flex 30 in an alternative embodiment of the invention in which module 10 expresses a datapath wider than that expressed by either of the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2 n-bits in width where the datapaths of CSPs 12 and 14 have a width of n-bits. As shown in FIG. 12, lower flex contacts 44E are connected to upper flex contacts 42E. Windows 62 pass through outer layer 52. In the alternative preferred embodiment for which second conductive layer 58 is shown in FIG. 12, module contacts 36 and 36E pass through windows 62 in second outer layer 52 of flex circuit 30, to contact appropriate lower flex contacts 44.

Figure 13:
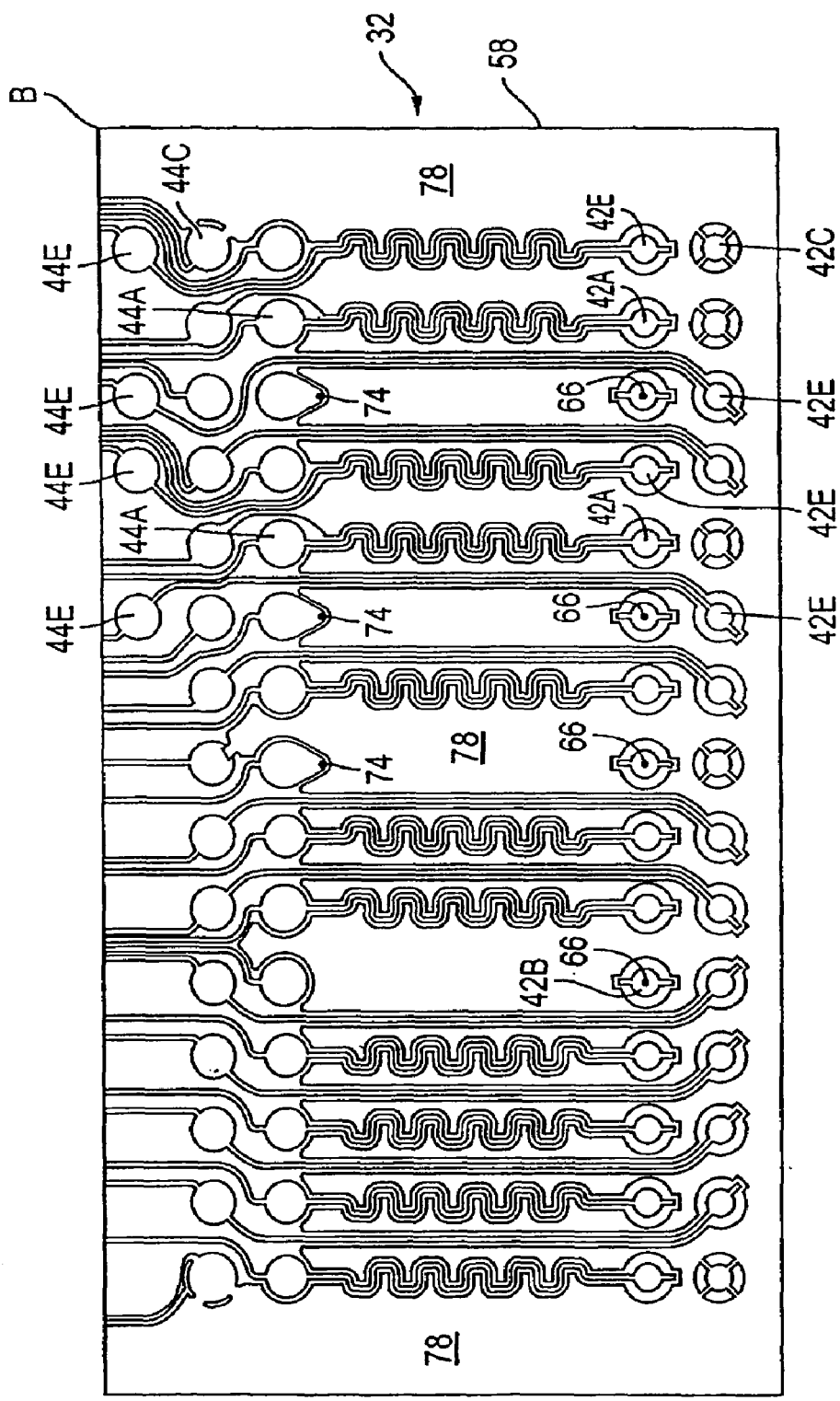
FIG. 13 depicts another second conductive layer of a flex circuit employed in an alternative embodiment of the present invention.

FIG. 13 illustrates second metal layer 58 of flex 32 in an alternative embodiment of the invention in which module 10 expresses a datapath wider than that expressed by either of the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2 n-bits in width where the datapaths of CSPs 12 and 14 have a width of n-bits. As shown in FIG. 13, lower flex contacts 44E are connected to upper flex contacts 42E. Windows 62 pass through outer layer 52. In the alternative preferred embodiment for which second conductive layer 58 is shown in FIG. 13, module contacts 36 pass through windows 62 in outer layer 52 of flex circuit 32, to contact appropriate lower flex contacts 44.

In particular, in the embodiment depicted in FIGS. 12 and 13, module contacts 36E contact flex contacts 44E and 44EE. Those of skill will recognize that lower flex contacts 44E are, in the depicted embodiment, eight (8) in number and that there is another lower flex contacts identified by reference 44EE shown on FIG. 12. Lower flex contact 44EE is contacted by one of the module contacts 36E to provide differential enablement between upper and lower CSPs. Those of skill will recognize that lower flex contacts 44E are connected to corresponding upper flex contacts 42E. CSP contacts 24 of upper CSP 12 that convey data are in contact with upper flex contacts 42E. Consequently, the datapaths of both upper CSP 12 and lower CSP 14 are combined to provide a wide datapath on module 10. With such as those depicted in FIGS. 4 and 5, lower flex contacts 44E of flex circuits 30 and 32 convey to module contacts 36E, the datapath of upper CSP 12, while other lower flex contacts 44 convey the datapath of lower CSP 14 to module contacts 36 to provide module 10 with a module datapath that is the combination of the datapath of upper CSP 12 and lower CSP 14. In the depicted particular embodiment of FIGS. 12 and 13, module 10 expresses a 16-bit datapath and CSP 12 and CSP 14 each express an 8-bit datapath.

Figure 14:
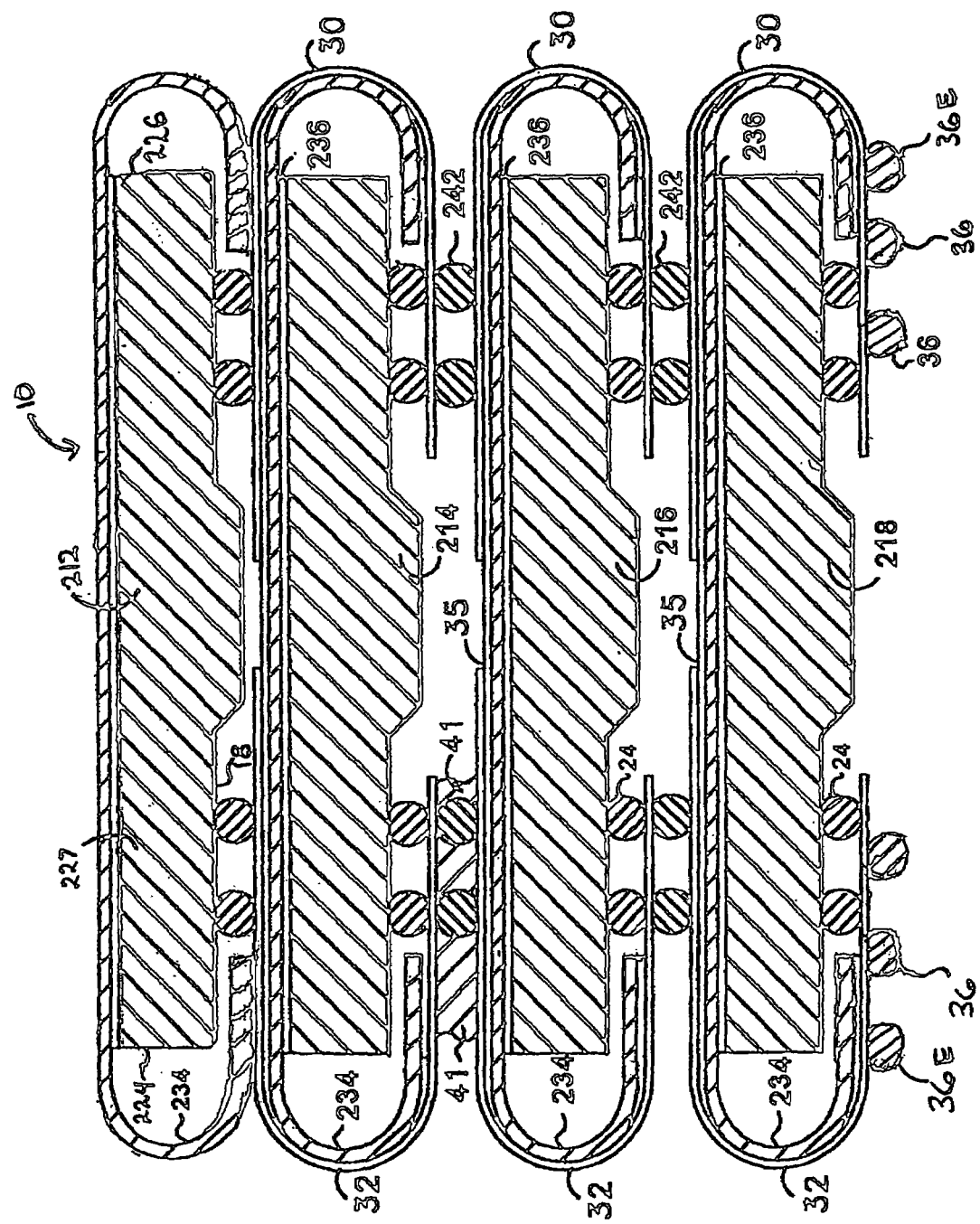
FIG. 14 depicts an alternative embodiment of the present invention in a four-high configuration.

FIG. 14 depicts another alternative embodiment of the invention having a four-high configuration. In this embodiment, module and supplemental contacts 36 and 36E are arranged in rows at an offset position from the rows of CSP contacts 24. Supplemental contacts 36E are depicted as offset toward the periphery of module 10, however this is not limiting and, as described with reference to FIGS. 7–13, supplemental contacts 36E may be arranged toward the interior of module 10. Further, while in depiction supplemental contacts 36E are depicted with a size and pitch similar to CSP contacts 24, this is not limiting and supplemental contacts 36E may be smaller or larger and have smaller or larger row and/or column pitches and may be arranged in a variety of groups having different pitches even within the array of module and supplemental contacts 36 and 35E.

Figure 15:
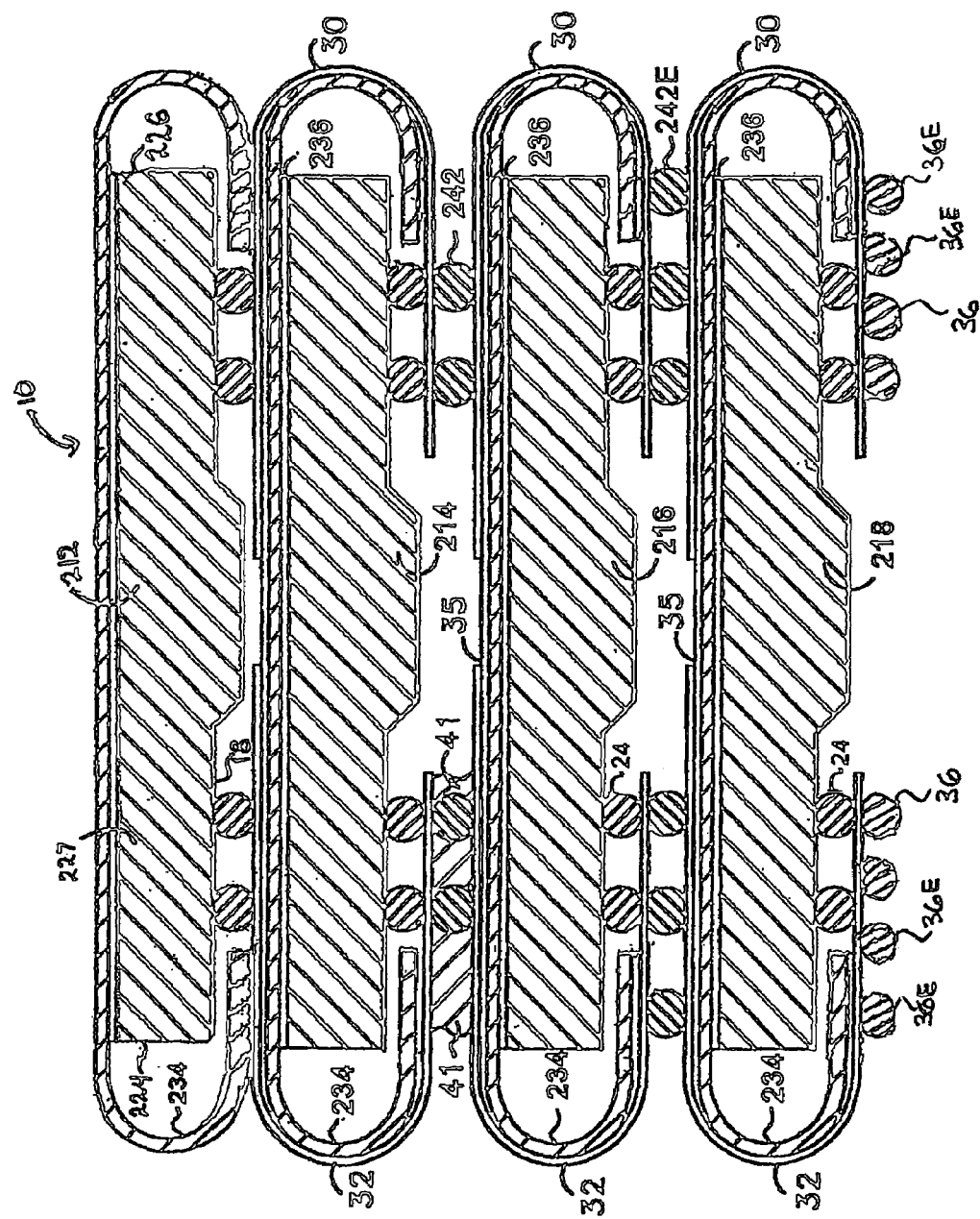
FIG. 15 depicts another alternative embodiment of the present invention in a four-high configuration.

FIG. 15 depicts another embodiment having a four-high configuration. In this embodiment, inter-flex contacts 242 between CSPs 216 and 218 are provided with supplemental inter-flex contacts 242E. As those having skill in the art will understand after appreciating this specification, supplemental inter-flex contacts 242E may be employed to expand the datapath and/or the number of other signaling paths to upper three CSPs depicted in FIG. 15. Further, the form standard 234 supporting supplemental inter-flex contacts 242E conducts and distributes heat along module 10 and is in thermal connection to supplemental inter-flex contacts 242E through flexes 30 and 32. While in this embodiment inter-flex contacts 242 and 242E are depicted with the same size and pitch, this depiction is not limiting and different pitches and sizes may be used, including low-profile CSP contacts, inter-flex contacts, and module contacts which may be devised similarly to those examples found in co-pending U.S. patent application Ser. Nos. 10/457,608 and 10/631,886. Further, while a four-high embodiment is depicted having four rows of supplemental module contacts 36E and an inter-flex connection scheme having two rows of supplemental inter-flex contacts 242E, a variety of schemes and variations are within the scope of the present invention. For example, supplemental inter-flex contacts 242E may appear between the highest pair CSPs, 212 and 214, or stacks of various greater or lesser heights may employ inter-flex contacts 242E and supplemental module contacts 36E as needed to expand signaling capability and improve thermal characteristics inherent to module 10 in a variety of embodiments.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

What is claimed is:

1. A high-density circuit module comprising:
    a first CSP having upper and lower major surfaces and a first and a second edge, the edges delineating a lateral extent for the upper major surface, and having a first set of CSP contacts disposed on the lower major surface and arranged in an at least one array, the at least one array having at least one row with a row pitch and at least one column with a column pitch;
    a second CSP in a stacked disposition above the first CSP;
    flex circuitry connecting the first and second CSPs and disposed to place a first portion of the flex circuitry beneath the lower major surface of the first CSP and a second portion of the flex circuitry between the first and second CSPs;
    a form standard disposed between the first and second CSPs, the form standard having a lateral extent greater than the lateral extent of the upper major surface of the first CSP, the form standard presenting at least one surface for contact with the flex circuitry;
    module contacts attached to the flex circuitry and arranged in an at least one array, the at least one array having at least one row with a row pitch and at least one column with a column pitch, the column pitch of the at least one array of module contacts being less than the column pitch of the at least one array of CSP contacts.

2. The high-density circuit module of claim 1 in which the module contacts have a row pitch less that of the CSP contacts.

3. The high-density circuit module of claim 2 in which the module contacts have at least one more row than does the first CSP.

4. The high-density circuit module of claim 1 in which the module contacts have at least one more row than does the first CSP.

5. The high-density circuit module of claim 4 or claim 3 in which the form standard extends underneath the first CSP in a central direction from at least one of the first and second edges, the form standard extending far enough underneath the first CSP to be disposed above at least one of the rows of module contacts.

6. The high-density circuit module of claim 1 in which the module contacts have at least one more column than does the first CSP.

7. The high-density circuit module of claim 6 in which the form standard extends underneath the first CSP in a central direction from at least one of the first and second edges, the form standard extending far enough in the central direction to be disposed above at least one of the rows of module contacts.

8. The high-density circuit module of claim 6 in which the form standard extends underneath the first CSP in a direction toward a middle of the CSP from at least one of the first and second edges, the form standard presenting a flat lower surface for support of at least one of the rows of module contacts, at least one of the rows of module contacts being partially outside a lateral extent a flat portion of the lower major surface of the first CSP.

9. The high-density circuit module of claim 1 in which the module contacts are solder balls having a smaller circumference than a circumference of the first set of CSP contacts.

10. The high-density circuit module of claim 1 in which the first set of CSP contacts of the first CSP are solder balls and the module contacts are solder balls having a radius smaller than those of the first set of CSP contacts.

11. The high-density circuit module of claim 1 which the module contacts are arranged in a horizontally offset position from the first set of CSP contacts in a manner disposed to place a first row of module contacts in the at least one module contact array in a position offset toward the lateral edge of the first CSP closest to that array.

12. The high-density circuit module of claim 1 in which the module contacts and the first set of CSP contacts are each arranged in two arrays and the module contacts are arranged in a horizontally offset position from the first set of CSP contacts in a manner disposed to produce a first space between the two arrays of module contacts, the first space being larger than a second space between the two arrays of the first set of CSP contacts.

13. The high-density circuit module of claim 1 which the module contacts are arranged in a horizontally offset position such that the columns of module contacts are horizontally offset from the columns of the first set of CSP contacts.

14. A high-density circuit module comprising:
a first CSP having upper and lower major surfaces and a first and a second edge, the edges delineating a lateral extent for the upper major surface, and having a first set of CSP contacts disposed on the lower major surface, the contacts being arranged in two groups, each of the groups having an X and Y inter-contact spacing separating selected ones of the module contacts from adjacent selected ones of that group's CSP contacts in X and Y directions, respectively, each of the groups being arranged in a pattern of rows which may be counted along the X direction and the Y direction;
a second CSP;
flex circuitry connecting the first and second CSPs and disposed to place a first portion of the flex circuitry beneath the lower major surface of the first CSP and a second portion of the flex circuitry disposed between the first and second CSPs;
a form standard disposed between the first and second CSPs, the form standard having a lateral extent greater than the lateral extent of the upper major surface of the first CSPs, the form standard presenting at least one surface for contact with the flex circuitry;
module contacts attached to the flex circuitry, the module contacts being arranged in two groups, each of the module contact groups having an X and Y inter-contact spacing separating selected ones of the module contacts from selected adjacent ones of that group's module contacts in X and Y directions, respectively, the contacts being arranged in a pattern of rows which may be counted along the X direction and the Y direction, the pattern of rows having at least one more row than the CSP contacts in at least one group in at least one direction, such that there are more module contacts than first set of CSP contacts.

15. The high-density circuit module of claim 14 in which the module contacts have a Y inter-contact spacing less than a Y inter-contact spacing of the first CSP.

16. The high-density circuit module of claim 15 in which the module contacts have at least one more row of contacts in the Y direction than does the first CSP.

17. The high-density circuit module of claim 15 in which the module contacts have at least one more row of contacts in the X direction than does the first CSP.

18. The high-density circuit module of claim 14 in which the module contacts have at least one more row of contacts in the Y direction than does the first CSP.

19. The high-density circuit module of claim 18 or claim 16 in which the form standard extends underneath the first CSP in a central direction from at least one of the first and second edges, the form standard extending far enough underneath the first CSP to be disposed above at least one of the rows of module contacts.

20. The high-density circuit module of claim 14 in which the module contacts have at least one more row of contacts in the X direction than does the first CSP.

21. The high-density circuit module of claim 20 or claim 17 in which the form standard extends underneath the first CSP in a central direction from at least one of the first and second edges, the form standard extending far enough underneath the first CSP to be disposed above at least one of the rows of module contacts.

22. The high-density circuit module of claim 14 in which the module contacts have a X inter-contact spacing less than the X inter-contact spacing of the first CSP.

23. The high-density circuit module of claim 14 in which the module contacts have a X inter-contact spacing less than the X inter-contact spacing of the first CSP and the module contacts have at least one extra row of contacts in the X direction.

24. The high-density circuit module of claim 14 in which the module contacts are solder balls having a smaller circumference than a circumference of the first set of CSP contacts.

25. The high-density circuit module of claim 14 in which the first set of CSP contacts of the first CSP are solder balls and the module contacts are solder balls having a radius smaller than those of the first set of CSP contacts.

26. The high-density circuit module of claim 14 in which the module contacts have a Y inter-contact spacing less than the Y inter-contact spacing of the first CSP.

27. The high-density circuit module of claim 14 which the module contacts are arranged in a horizontally offset position from the first set of CSP contacts such that a first row, counted in the Y direction, of module contacts in each module contact group is offset toward the lateral edge of the first CSP closest to the group, such that there is a larger space between the groups of module contacts than that between the groups of the first set of CSP contacts.

28. The high-density circuit module of claim 14 which the module contacts are arranged in a position horizontally offset in the X direction from the first set of CSP contact.

29. A high-density circuit module comprising:
two or more CSPs arranged in a stacked arrangement having a bottom CSP, each of the CSPs having first and second opposing lateral sides defining a lateral extent of the CSP, each of the CSPs having a top major surface and a bottom major surface, each of the CSPs having CSP contacts on the bottom major surface;
a form standard attached to the bottom CSP, the form standard having one or more extensions disposed underneath the bottom CSP;
one or more flex circuits connecting selected pairs of the two or more CSPs to each other, at least one of the one or more flex circuits being wrapped about the form standard such that a first portion of the at least one flex circuit is disposed above the bottom CSP and a second portion of the at least one flex circuit is disposed below the bottom CSP;
a plurality of module contacts attached to the at least one flex circuit wrapped about the form standard, the module contacts for electrically connecting the high-density circuit module to an operating environment;
a plurality of supplemental module contacts attached to the at least one flex circuit wrapped about the form standard, the supplemental module contacts for electrically connecting the high-density circuit module to an operating environment, the supplemental contacts being disposed below and horizontally offset from the CSP contacts of the bottom CSP, selected ones of the supplemental contacts being disposed below respective ones of the one or more extensions of the form standard.

30. The high-density circuit module of claim 29 in which the CSP contacts on the bottom CSP are arranged in a first array of rows and columns having respective row and column pitches, and in which the module contacts and the supplemental contacts are arranged in a second array of rows and columns having respective row and column pitches, at least one of the row pitches of the second array being different from a selected row pitch of the first array.

31. The high density circuit module of claim 30 in which the at least one different row pitch is smaller than the selected row pitch of the first array.

32. The high-density circuit module of claim 29 in which the CSP contacts on the bottom CSP are arranged in a first array of rows and columns having respective row and column pitches, and in which the module contacts and the supplemental contacts are arranged in a second array of rows and columns having respective row and column pitches, at least one of the column pitches of the second array being different from a selected column pitch of the first array.

33. The high density circuit module of claim 32 in which the at least one different column pitch is smaller than the selected column pitch of the first array.

34. A high-density circuit module comprising:
two or more CSPs arranged in a stacked arrangement having a bottom CSP, each of the CSPs having first and second opposing lateral sides defining a lateral extent of the CSP, each of the CSPs having a top major surface and a bottom major surface, each of the CSPs having CSP contacts on the bottom major surface, the CSP contacts on the bottom CSP being arranged in a first array of rows and columns having respective row and column pitches;
a form standard attached to the bottom CSP;
one or more flex circuits connecting selected pairs of the two or more CSPs to each other, at least one of the one or more flex circuits being wrapped about the form standard such that a first portion of the at least one of the one or more flex circuits is disposed above the bottom CSP and a second portion of the at least one of the one or more flex circuits is disposed below the bottom CSP;
a plurality of module contacts attached to the at least one of the one or more flex circuits wrapped about the form standard, the module contacts for electrically connecting the high-density circuit module to an operating environment;
a plurality of supplemental module contacts attached to the at least one of the one or more flex circuits wrapped about the form standard, the supplemental module contacts for electrically connecting the high-density circuit module to an operating environment, the module contacts and the supplemental contacts being arranged in a second array of rows and columns having respective row and column pitches, at least one of the row pitches of the second array being smaller than a selected row pitch of the first array, the combined number of module and supplemental contacts being greater than the number of CSP contacts of bottom CSP.

* * * * *